United States Patent
Son et al.

(10) Patent No.: US 10,177,728 B2
(45) Date of Patent: Jan. 8, 2019

(54) ELECTRONIC APPARATUS AND CONTROL METHOD THEREOF

(71) Applicant: SAMSUNG ELECTRONICS CO., LTD., Suwon-si (KR)

(72) Inventors: Sang-mo Son, Suwon-si (KR); Hyunjoo Chung, Suwon-si (KR); Byeong-seob Ko, Suwon-si (KR); Anant Baijal, Suwon-si (KR); Hyeon-sik Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/627,603

(22) Filed: Jun. 20, 2017

(65) Prior Publication Data

US 2018/0054174 A1    Feb. 22, 2018

(30) Foreign Application Priority Data

Aug. 17, 2016    (KR) .................. 10-2016-0104300

(51) Int. Cl.
| | |
|---|---|
| *H03G 3/00* | (2006.01) |
| *H03G 3/30* | (2006.01) |
| *G06F 3/16* | (2006.01) |
| *H03G 3/32* | (2006.01) |
| *H04R 3/04* | (2006.01) |

(52) U.S. Cl.
CPC .......... *H03G 3/3005* (2013.01); *G06F 3/165* (2013.01); *H03G 3/32* (2013.01); *H04R 3/04* (2013.01)

(58) Field of Classification Search
CPC .......... H03G 3/3005; H03G 3/32; H04R 3/04; G06F 3/165
See application file for complete search history.

(56) References Cited

U.S. PATENT DOCUMENTS

| | | | |
|---|---|---|---|
| 8,284,960 B2 * | 10/2012 | Vaudrey ................ | H03G 7/002 381/106 |
| 2003/0084448 A1 | 5/2003 | Soundararajan | |
| 2006/0046685 A1 | 3/2006 | Hjelmeland | |
| 2009/0169026 A1 | 7/2009 | Shimazaki et al. | |
| 2010/0073562 A1 | 3/2010 | Miyoshi | |
| 2011/0211702 A1 | 9/2011 | Mundt et al. | |
| 2013/0342669 A1 | 12/2013 | Hsu | |
| 2015/0237454 A1 | 8/2015 | Scheirer et al. | |

FOREIGN PATENT DOCUMENTS

| | | |
|---|---|---|
| JP | 2004-37823 A | 2/2004 |
| KR | 10-2013-0004373 A | 1/2013 |

OTHER PUBLICATIONS

Communication dated Oct. 10, 2017 in International Patent Application No. PCT/KR2017/006410 (PCT/ISA/210).

* cited by examiner

*Primary Examiner* — Andrew L Sniezek
(74) *Attorney, Agent, or Firm* — Sughrue Mion, PLLC

(57) ABSTRACT

An electronic apparatus and a method for controlling the electronic apparatus are provided. The electronic apparatus includes an audio processor that outputs an audio including a first audio component and a second audio component and a controller that controls the audio processor to change a ratio of the first audio component to the second audio component according to the changed audio level, in response to receiving an instruction to change a level of the output audio.

20 Claims, 17 Drawing Sheets

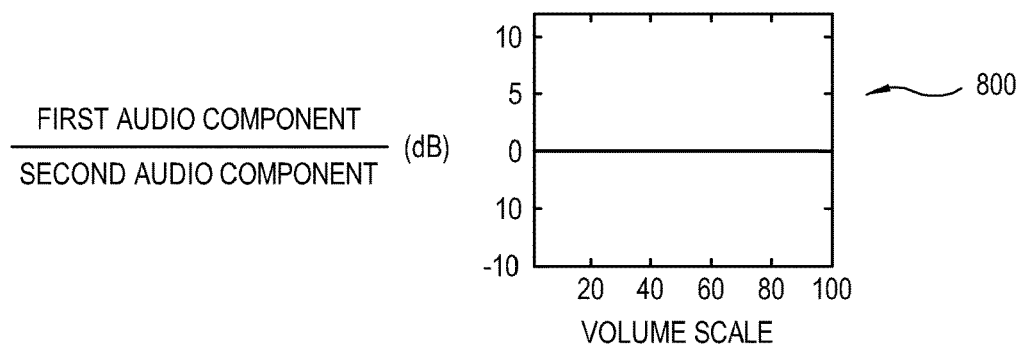
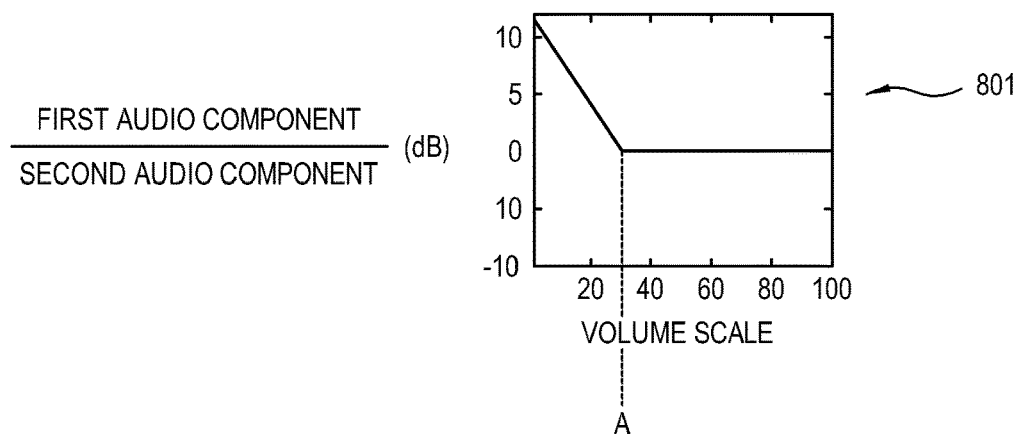
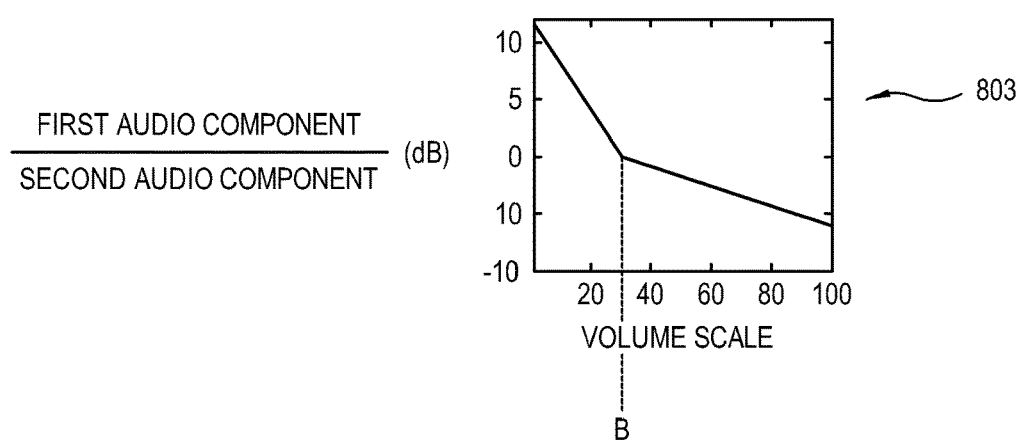

FIG. 16
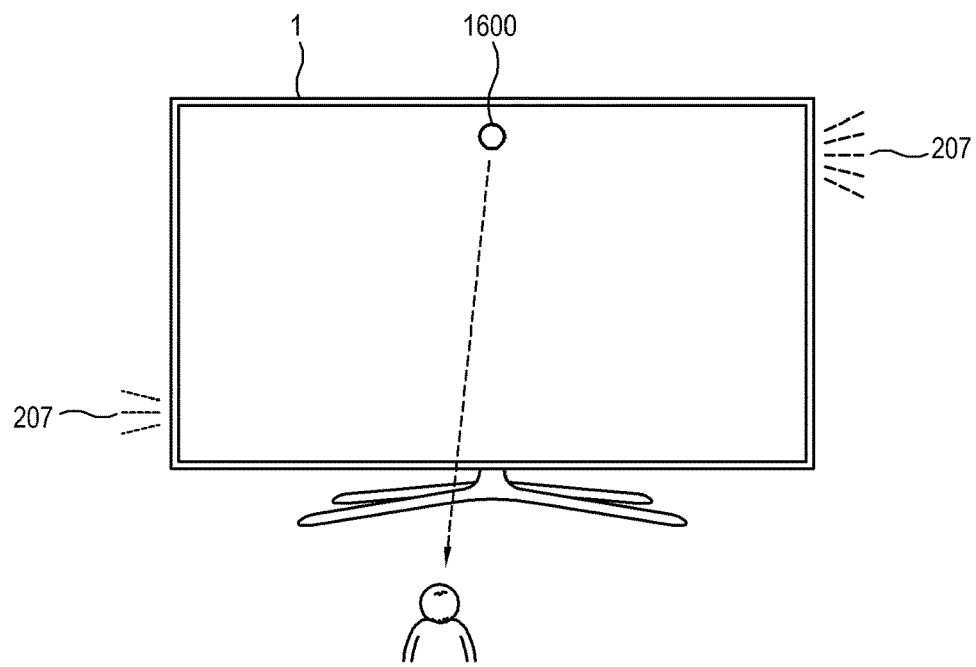
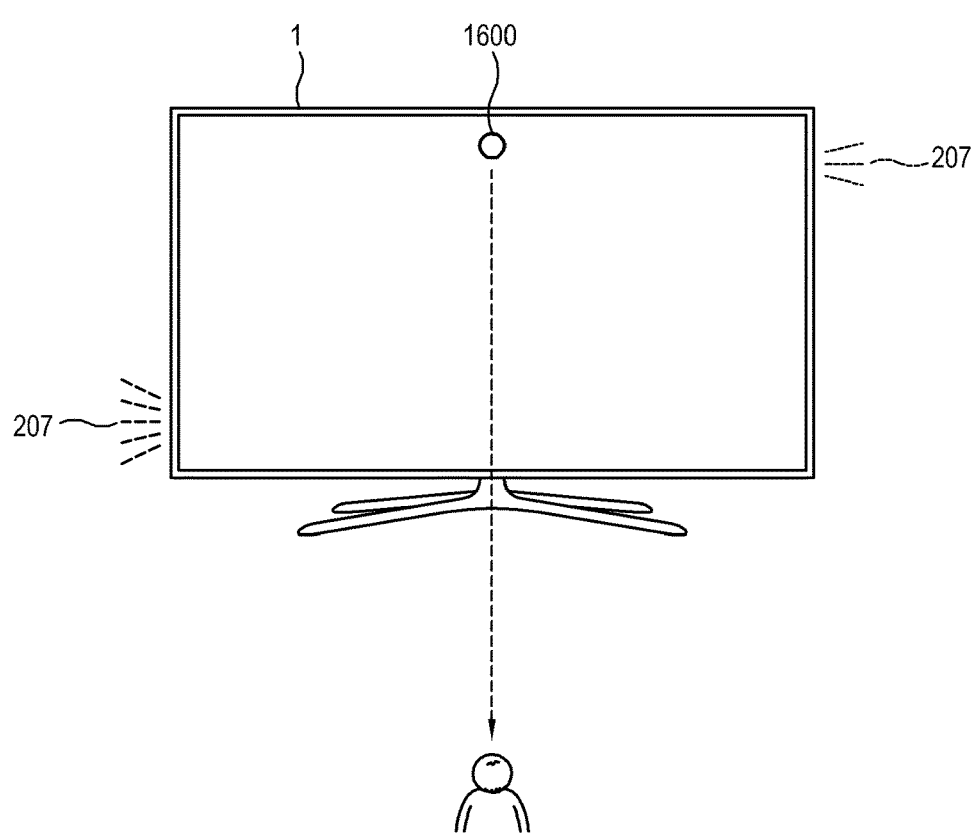

ELECTRONIC APPARATUS AND CONTROL METHOD THEREOF

CROSS-REFERENCE TO RELATED APPLICATION

This application claims priority from Korean Patent Application No. 10-2016-0104300, filed on Aug. 17, 2016 in the Korean Intellectual Property Office, the disclosure of which is incorporated herein by reference in its entirety.

BACKGROUND

1. Field

Apparatuses and methods consistent with exemplary embodiments relate to an electronic apparatus, and more particularly to an electronic apparatus capable of changing audio characteristic to match various environments in which the audio is output, and a method of controlling the electronic apparatus to change the audio characteristic.

2. Description of Related Art

An electronic apparatus, such as a television (TV), an audio apparatus and so on, outputs an audio of a broadcasting or a multimedia content. The audio output of the electronic apparatus may be variously implemented, but, for example, in a TV for family use, is often implemented in a simple type, such as a stereo speaker or the like. Accordingly, since sound listening environment of the TV at home centers around the simple stereo speaker implemented in the TV, the audio output at home is limited as compared with an audio output at a theater or a specialized audio/video (A/V) listening room.

The audio that the electronic apparatus outputs may include various audio components according to substances of the broadcasting or the multimedia content. The audio components may be, for example, performer's lines or background music in a movie, anchor's voices in news, stadium cheering in sports, etc. By the way, if a user reduces a volume of audio at night time or not to disturb anyone, even audio components the user wants to listen are also decreased as all the audio components are decreased. For example, if the user decreases the volume of audio while watching a movie, the user may have difficulty hearing performer's lines, which deliver information. Accordingly, there is a problem in that it is difficult for the user to properly adjust audio components the user wants only by adjusting the volume of audio.

In a related art electronic apparatus, in order adjust the audio components the user wants, the user selects an acoustic mode, from among a plurality of acoustic modes of emphasizing specific audio components, respectively, using a menu provided by the electronic apparatus. However, in this case, there is a discomfort in that the user has to locate and select every acoustic mode she or he wants on the menu.

SUMMARY

Exemplary embodiments address at least the above problems and/or disadvantages and other problems and disadvantages not described above. Also, the exemplary embodiments are not required to overcome the problems and disadvantages described above, and may not overcome any of the problems and disadvantages described above.

Exemplary embodiments may provide an electronic apparatus capable of changing audio characteristic to emphasize at least one audio component a user wants only by a simple user manipulation or without any user manipulation, thereby providing an enhanced user convenience, and a control method thereof.

According to an aspect of an exemplary embodiment, there is provided an apparatus comprising: an audio processor configured to output an audio including a first audio component and a second audio component; and a controller configured to control the audio processor to, in response to receiving an instruction to change a level of the output audio, change a ratio of the first audio component to the second audio component according to the changed audio level.

The controller may be further configured to control the audio processor to separate the audio into the first audio component and the second audio component and to adjust a gain of at least one of the first audio component and the second audio component to change the ratio of the first audio component to the second audio component.

The controller may be further configured to control the audio processor to emphasize a peak of the first audio component at a frequency range to change the ratio of the first audio component to the second audio component.

The controller may be further configured to control the audio processor to change the ratio of the first audio component to the second audio component into a first value in response to the changed audio level being equal to or more than a predetermined standard value and to control the audio processor to change the ratio of the first audio component to the second audio component into a second value different from the first value in response to the changed audio level being less than the predetermined standard value.

The controller may be further configured to control the audio processor to change the ratio of the first audio component to the second audio component according to the changed audio level based on a predetermined condition, The predetermined condition may comprise a condition input from a user, received from an outside, or recognized by the apparatus.

The controller may be further configured to control the audio processor to change the ratio of the first audio component to the second audio component based on at least one of a previous use history of user and a type of content.

The first audio component may comprise a voice, and the second audio component comprises a background audio.

The apparatus may further comprise a display configured to display an image corresponding to the audio.

The controller may be further configured to control the audio processor to change the ratio of the first audio component to the second audio component according to at least one of an ambient illuminance intensity, an ambient voice, a number of users, a location of user, a type of displayed image and an existence or nonexistence of closed caption.

The controller may be further configured to change the level of the output audio based on a previous use history and current state information.

According to an aspect of another exemplary embodiment, there is provided a control method of an electronic apparatus comprising: outputting an audio including a first audio component and a second audio component; and in response to receiving an instruction to change a level of the output audio, changing a ratio of the first audio component to the second audio component according to the changed audio level.

The changing the ratio of the first audio component to the second audio component may comprise: separating the audio into the first audio component and the second audio component; and adjusting a gain of at least one of the first audio component and the second audio component to change the ratio of the first audio component to the second audio component.

The changing the ratio of the first audio component to the second audio component may comprise emphasizing a peak of the first audio component at a frequency range to change the ratio of the first audio component to the second audio component.

The changing the ratio of the first audio component to the second audio component may comprise changing the ratio of the first audio component to the second audio component into a first value in response to the changed audio level being equal to or more than a predetermined standard value and changing the ratio of the first audio component to the second audio component into a second value different from the first value in response to the changed audio level being less than the predetermined standard value.

The changing the ratio of the first audio component to the second audio component may comprise changing the ratio of the first audio component to the second audio component according to the changed audio level based on a condition input from a user, received from an outside, or recognized by the apparatus.

The method may further comprise changing the ratio of the first audio component to the second audio component based on at least one of a previous use history of user and a type of content.

The first audio component may comprise a voice, and the second audio component comprises a background audio.

The method may further comprise displaying an image corresponding to the audio.

The changing the ratio of the first audio component to the second audio component may comprise changing the ratio of the first audio component to the second audio component according to at least one of an ambient illuminance intensity, an ambient voice, a number of users, a location of user, a type of displayed image and an existence or nonexistence of closed caption.

The method may further comprise changing the level of the output audio based on a previous use history and current state information.

According to an aspect of another exemplary embodiment, there is provided an apparatus comprising: a processor configured to: output an audio including a first audio component and a second audio component; and in response to receiving a signal, selectively control a level of the first audio component to be at a first level and a level of the second audio component to be at a second level in accordance with a relationship between the first level of the first audio component and the second level of the second audio component.

The processor may be further configured to selectively control the level of the first audio component to be at the first level according to a first parameter and the level of the second audio component to be at the second level according to a second parameter different from the first parameter.

The first parameter may be a first degree of amplification and the second parameter may be a second degree of amplification.

The first parameter may be a first rate of change of the level of the first audio component and the second parameter may be a second rate of change of the level of the second audio component.

The signal may be a control signal to change a third level of the audio.

According to an aspect of another exemplary embodiment, there is provided a control method of an electronic apparatus including: outputting an audio including a first audio component and a second audio component; and in response to receiving a signal, selectively controlling a level of the first audio component to be at a first level and a level of the second audio component to be at a second level in accordance with a relationship between the first level of the first audio component and the second level of the second audio component.

The controlling the level of the first audio component to be at the first level and the level of the second audio component to be at the second level may further include selectively controlling the level of the first audio component to be at the first level according to a first parameter and the level of the second audio component to be at the second level according to a second parameter different from the first parameter.

The first parameter may be a first degree of amplification and the second parameter may be a second degree of amplification The first parameter may be a first rate of change of the level of the first audio component and the second parameter may be a second rate of change of the level of the second audio component.

The signal may be control signal to change a third level of the audio.

BRIEF DESCRIPTION OF THE DRAWINGS

The above and/or other aspects will be more apparent from the following description of exemplary embodiments taken in conjunction with the accompanying drawings, in which:

FIGS. 7A, 7B and 7C illustrate graphs showing ratios of a first audio component to a second audio component according to an exemplary embodiment;

FIG. 16 illustrates an example of additionally changing the ratio of the first audio component to the second audio component based on a location of detected user according to an exemplary embodiment.

DETAILED DESCRIPTION OF EXEMPLARY EMBODIMENTS

Figure 1:
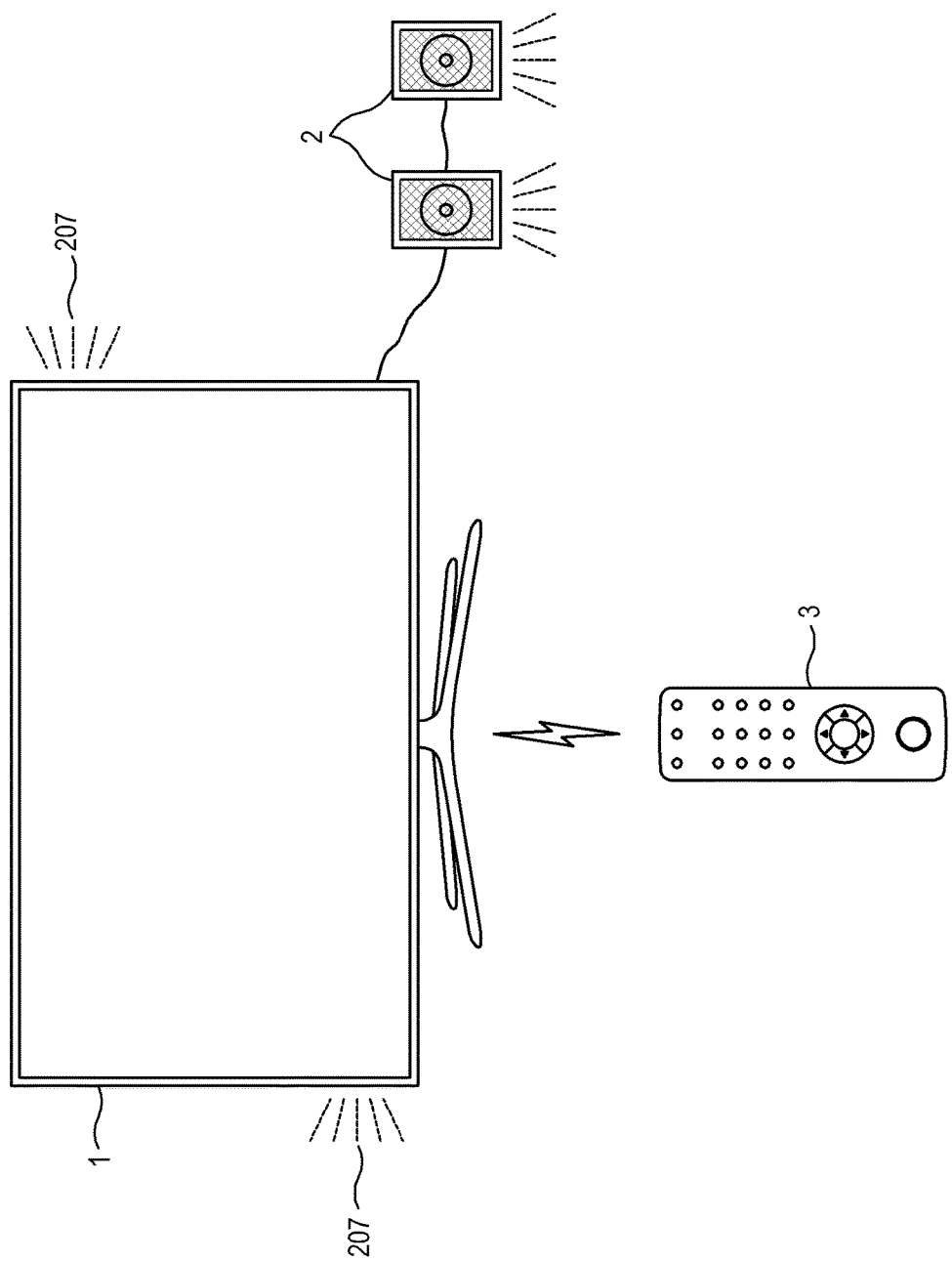
FIG. 1 illustrates an electronic apparatus according to an exemplary embodiment.

Hereinafter, exemplary embodiments will be described in detail with reference to accompanying drawings. Elements illustrated in the accompanying drawings are referred to in the following descriptions of the exemplary embodiments and for clarity, like reference numerals or symbols presented in respective drawings denote like elements, which substantially perform the same functions.

In the following description, if terminologies, each of which includes such an ordinal number as 'first', 'second' and the like, are used, those terminologies are used (unless expressly specified otherwise) merely to describe various elements. The terminologies are only used for the purpose of differentiating one element from other elements. In doing so, the various elements should be non-limited by the corresponding terminologies, respectively. The terminologies used in the following description of various exemplary embodiments are applied for explanation purpose only and not for the purpose of limiting the exemplary embodiments as defined by the appended claims and their equivalents.

The present disclosure described below with reference to the exemplary embodiments may be applied to an electronic apparatus, which outputs an audio of a content. As an implementation example of the electronic apparatus to which the present disclosure is applied, a display apparatus, which displays an image of the content while outputting the audio, will be described by way of illustration. However, the present disclosure is not limited thereto and may be also applied to many electronic apparatuses, such as an audio apparatus, an A/V apparatus, etc., which can output the audio.

FIG. 1 illustrates an electronic apparatus according to an exemplary embodiment.

The electronic apparatus 1 provides a content including an audio portion for a user. As illustrated in FIG. 1, the electronic apparatus 1 as an exemplary embodiment may be implemented as a display apparatus, such as a TV. As other exemplary embodiments, the electronic apparatus 1 may be implemented as various electronic apparatuses capable of outputting audio, such as a tablet personal computer (PC), a mobile phone, a multimedia reproducing device, an electronic picture frame, a digital advertising board, a large format display (LFD), a set-top box, a MP3 player, a digital versatile disk (DVD) player, a blu-ray disc (BD) player, a radio apparatus, an A/V receiver, a speaker apparatus, an audio apparatus for vehicles, etc. The electronic apparatus 1 processes a content signal received from an outside to provide the content. The content signal may include a broadcast signal transmitted from a broadcasting station, a data packet signal transmitted via s network, or a signal transmitted from a multimedia apparatus connected to the electronic apparatus 1. In another exemplary embodiment, the content may be generated from data stored in the electronic apparatus 1.

According to an exemplary embodiment, the content includes an audio portion. According to another exemplary embodiment, the content may further include an image portion or other information in addition to the audio portion. The electronic apparatus 1 outputs the audio content via an audio output 207 provided in the electronic apparatus 1 or a speaker 2 connected to a connector (205 in FIG. 2) in the electronic apparatus 1.

The electronic apparatus 1 changes characteristic of the audio output by the audio output 207 or the speaker 2. The audio characteristic may be attributes about audio components, which constitutes the audio of the content. The audio of the content according to an exemplary embodiment includes a first audio component and a second audio component. The first audio component may be, for example, performer's lines, narrations or the like in the content, such as a movie, and the second audio component may be, for example, a background audio or the like in the movie. According to an exemplary embodiment, the first audio component and the second audio component are not limited thereto, and if any plurality of components is capable of being separated from the audio of the content, such components may also be applied to the present disclosure without restriction. For example, the first audio component and the second audio component may be a first channel and a second channel, a main component and an auxiliary component, or a central component and a peripheral component in a stereo audio signal. Also, the number of the audio components according to an exemplary embodiment is not limited to two components, and three or more components may be also applied.

If a level of the output audio is changed, the electronic apparatus 1 according to an exemplary embodiment changes a ratio of the first audio component to the second audio component according to the changed audio level. The audio level may be a volume of the audio. For example, if the user changes the volume of the audio using a controller 3, the electronic apparatus 1 may change the ratio of the first audio component to the second audio component according to the changed volume of the audio. To be more specific, for example, if the volume of the audio becomes less than or more than a predetermined standard value according a user manipulation, the electronic apparatus 1 may change the ratio of the first audio component to the second audio component to relatively emphasize one from among the first audio component and the second audio component compared to the other. For example, if while watching the content, such as the movie, as described above, the user decrease or reduces the volume of the audio to less than the predetermined standard value, the electronic apparatus 1 may change the ratio of the first audio component to the second audio component to relatively emphasize the first audio component corresponding to the performer's lines compared to the second audio component corresponding to the background audio. As another exemplary embodiment, the electronic apparatus 1 may change the ratio of the first audio component to the second audio component according to a volume of the audio changed as a predetermined condition is satisfied without any user manipulation.

As described above, the electronic apparatus 1 according to an exemplary embodiment may relatively emphasize the audio component the user wants from among the plurality of audio components included in the audio only by a simple user manipulation, such as reducing the volume of the audio, or without any user manipulation, thereby providing an enhanced user convenience.

The change of the ratio of the first audio component to the second audio component according to an exemplary embodiment is not limited to the illustrations as described above. For example, the ratio of the first audio component to the second audio component may be also changed to relatively emphasize the second audio component compared to the first audio component. Also, if the volume of the audio becomes equal to or greater than the predetermined standard value, the ratio of the first audio component to the second audio component may be changed to relatively emphasize one from among the first audio component and the second audio component compared to the other.

As another exemplary embodiment, if there are three or more audio components, the ratio of the first audio component to the second audio component may be changed to relatively emphasize two or more audio components compared to the remainder. In this case, extents to which two or more audio components are emphasized, respectively, may be the same or different.

Hereinafter, a configuration of the electronic apparatus 1 according to an exemplary embodiment will be described in detail.

Figure 2:
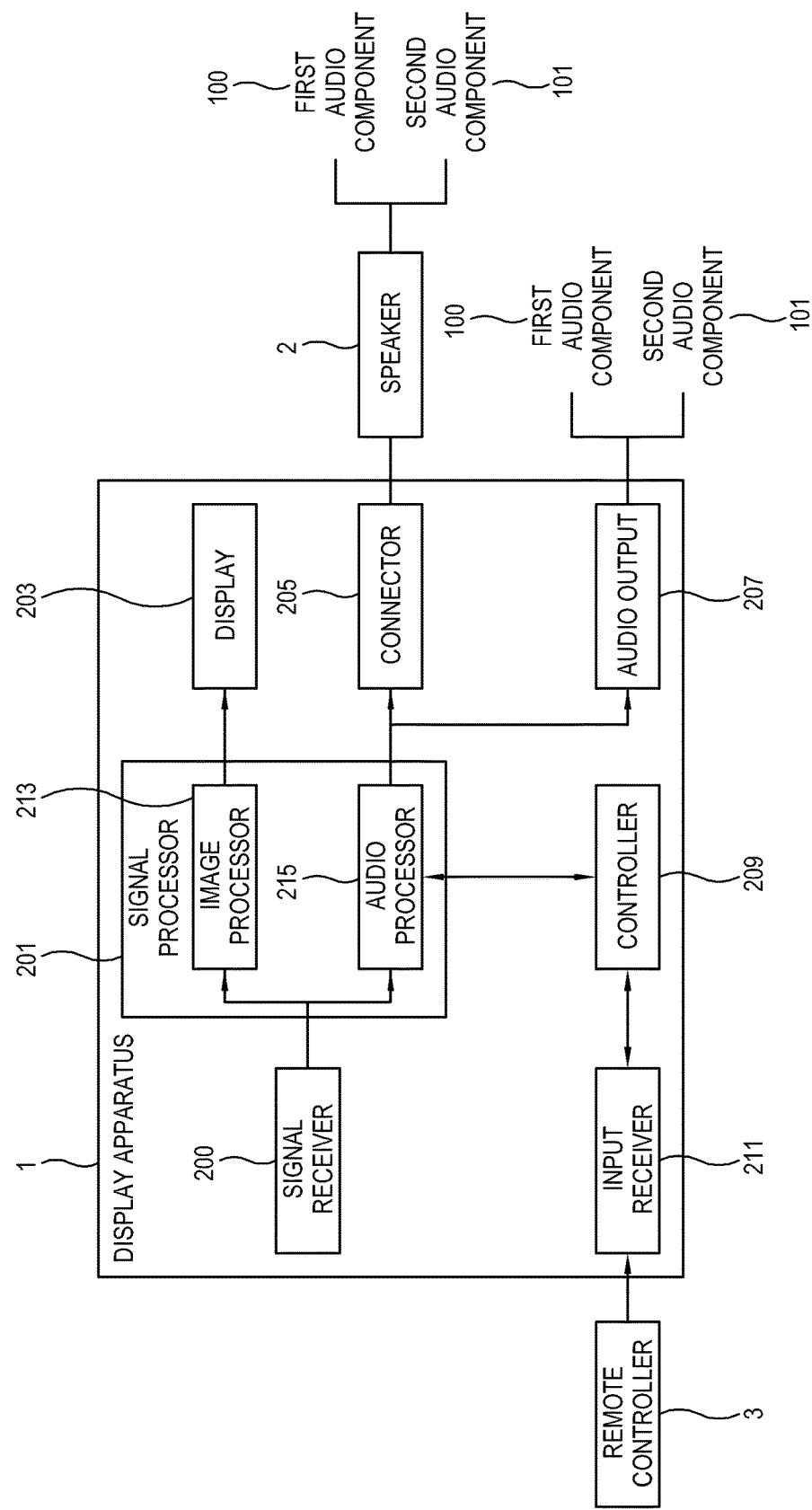
FIG. 2 is a block diagram of an electronic apparatus according to an exemplary embodiment.

FIG. 2 is a block diagram of the electronic apparatus 1 according to an exemplary embodiment. The electronic apparatus 1 includes a signal processor 201 and a controller 209. The electronic apparatus 1 may further include at least one of a signal receiver 200, an audio output 207, a connector 205, a display 203, and an input receiver 211. The configuration of the electronic apparatus 1 as illustrated in FIG. 2 is merely an example, and the electronic apparatus 1 according to an exemplary embodiment may be also implemented by configurations different from the configuration illustrated in FIG. 2. In other words, the electronic apparatus 1 according to an exemplary embodiment may be implemented by including one or more additional elements other than those illustrated in FIG. 2 or removing one or more of the elements, from among elements illustrated in FIG. 2.

The signal receiver 200 receives a content signal including an image and an audio from an outside. The content signal may be received in a form of transport stream. As an exemplary embodiment, the signal receiver 200 may receive as a content signal, a broadcast signal of any one selected by the user from among a plurality of channels. The signal receiver 200 may receive the content signal from an image processing apparatus, such as a set-top box, a digital versatile disc (DVD) player, and a personal computer (PC), a mobile apparatus, such as a smart phone, or a server via an internet.

The display 203 displays an image based on an image signal processed by the signal processor 201. The display 203 may be implemented in various display types and methods, such as liquid crystal display (LCD), plasma display panel (PDP), light-emitting diode (LED) display, organic light emitting diode (OLED) display, surface-conduction electron-emitter, carbon nano-tube, nano-crystal display, etc., but the display 203 is not limited to these exemplary implementations.

If the display 203 is a LCD type, the display 203 includes a LCD panel, a backlight unit to supply light to the LCD panel, a panel driving board to drive the LCD panel, etc. The display 203 may be also implemented as an OLED panel, which is a spontaneous emission panel, without the backlight unit.

The signal processor 201 processes the content signal received via the signal receiver 200 to output the image and the audio via the display 203 and the audio output 207. The signal processor 201 includes an image processor 213 for performing an image processing and an audio processor 215 for performing an audio processing.

The image processor 213 performs an image processing process with respect to an image signal extracted from the transport stream received via the signal receiver 200, and outputs the processed image signal to display an image on the display 203. The image processing process, which is performed by the image processor 213, may include, for example, a demultiplexing to divide the input transport stream into subordinate streams, which includes an image signal, an audio signal and additional data, respectively, a de-interlacing to convert an interlace type image signal into a progressive type image signal, a scaling to change the image signal in definition, a noise reduction for enhancing an image quality, a detail enhancement, a frame refresh rate conversion, etc.

The audio processor 215 performs various processes with respect to an audio signal. If the signal receiver 200 receives the transport stream, the audio processor 215 performs an audio process with respect to an audio signal extracted from the transport stream, and outputs the processed audio signal to the audio output 207, or the speaker 2 via the connector 205 to provide an audio for the user.

The audio processor 215 may change a level of the output audio according to a control of the controller 209. The audio processor 215 may separate a first audio component 100 and a second audio component 101 included in the audio, and change a ratio of the first audio component 100 to the second audio component 101 according to the control of the controller 209. Detailed configuration on the audio processor 215 will be described later.

The audio output 207 outputs the audio base on the audio signal output from the audio processor 215. The audio output 207 is configured to output an audio in a frequency band of, for example, 20 Hz to 20 KHz, which is an audible frequency. The audio output 207 may be installed at various positions of the display 203 in consideration of processable audio channels and output frequencies. For example, the audio output 207 may be disposed at left and right corners of the display 203. The audio output 207 may include at least one of a subwoofer, a midwoofer, a midrange speaker, and a tweeter speaker according to a frequency band of the audio to be output.

The connector 205 may include a plurality of terminals capable of transmitting the audio processed at the audio processor 215 to the speaker 2.

The input receiver 211 receives a user input to transmit to the controller 209. The input receiver 211 may be implemented as various types according to user input methods. For example, the input receiver 211 may be implemented as, for example, a menu button installed on an outer side the electronic apparatus 1, a remote control signal receiver to receive a remote control signal corresponding to the user input from a remote controller 3, a touch screen provided in the display 203 to receive a touch input of user, a camera to detect a gesture input of user, a microphone to recognize a voice input of user, a communicator to communicate with an external apparatus to receive a user input from the external apparatus, and so on.

According to an exemplary embodiment, the electronic apparatus 1 may change the level of audio when various other conditions are satisfied. According to another exemplary embodiment, the electronic apparatus 1 may change the level of audio based on the user input received via the input receiver 211. For example, the electronic apparatus 1 may change the level of audio based on a use history of user. To be more specific, the electronic apparatus 1 may store a previous use history in which the user has changed the audio to a specific level at a specific environment, such as a specific time, determine whether a current environment corresponds to the specific environment based the stored previous use history, and if the current environment corresponds to the specific environment, change the audio to the specific level. According to a specific example, if the user previously used to set the level of audio to 30 while using the electronic apparatus 1 alone after 9 p.m., the electronic apparatus 1 may change the level of audio to 30 when it is determined that the user is using the electronic apparatus 1 alone at 9 p.m.

As described above, the electronic apparatus 1 according to an exemplary embodiment may estimate or predict a user intension without any user's direct manipulation thereby to relatively emphasize the audio component that the user wants from among the audio components included in the audio, thereby providing a more enhanced user convenience.

The controller 209 may perform controls necessary for operating all the elements of the electronic apparatus 1. The controller 209 may include a control program for controlling to perform the control operation as described above. According to an exemplary embodiment, the controller may include a non-volatile memory in which the control program is installed, a volatile memory in which at least one of the control program is loaded, and at least one microprocessor or central processing unit (CPU) for executing the loaded control program. In another exemplary embodiment, the electronic apparatus may include a non-volatile memory in which the control program is installed, a volatile memory in which at least one of the control program is loaded, and at least one microprocessor or central processing unit (CPU) for executing the loaded control program. The control program may include a program (or programs) which is implemented in the form of at least one of a BIOS, a device driver, an operating system, a firmware, a platform, and an application program (application). As an exemplary embodiment, the application program may be installed or stored in advance in the electronic apparatus 1 in manufacturing, or installed in the electronic apparatus 1 based data for the application received from the outside in use. The data for the application program may be downloaded to the electronic apparatus 1 from an external server, such as, for example, an application market or the like.

As an exemplary embodiment, if the level of the output audio is changed as the user input is received or as the predetermined condition are satisfied, the controller 209 may control the audio processor 215 to change the ratio of the first audio component 100 to the second audio component 101 according to the changed level of audio.

For example, if the changed level of audio is equal to or more than a predetermined standard value, the controller 209 may change the ratio of the first audio component to the second audio component to relatively emphasize any one from among the first audio component and the second audio component compared to the other. According to another example, when the changed level of audio is equal to or less than a predetermined standard value, the controller 209 may change the ratio of the first audio component to the second audio component to relatively emphasize any one from among the first audio component and the second audio component compared to the other. In other words, the controller 209 may change a ratio between the first audio component 100 and the second audio component 101 in case that the changed level of audio is equal to or more than the predetermined standard value and a ratio between the first audio component 100 and the second audio component 101 in case that the changed level of audio is less than the predetermined standard value, so that they are different from each other. For example, the controller 209 may change the ratio of the first audio component to the second audio component, so that the lower the changed level of audio is, the more the first audio component 100 is increased in share, and the higher the changed level of audio is, the more the second audio component 101 is increased in share. As mentioned above, the first audio component and the second audio component may correspond to the performer's lines and the background audio, respectively, in the content such as the movie. In this case, the ratio is changed, so that if the level of audio is low, the performer's lines for communicating information to the user are sounded relatively louder and if the level of audio is high, the background audio for vividly delivering a sense of immediacy is sounded relatively louder. Thus, the audio component the user wants may be emphasized only with the simple user manipulation.

To change the ratio between the first audio component 100 and the second audio component 101, the audio processor 215 may adjust a gain of at least one of the first audio component 100 and the second audio component 101. According to another exemplary embodiment, to change the ratio between the first audio component 100 and the second audio component 101, the audio processor 215 may emphasize a peak of frequency, which corresponds to the first audio component 100 and/or the second audio component 101 at a frequency area.

Figure 3:
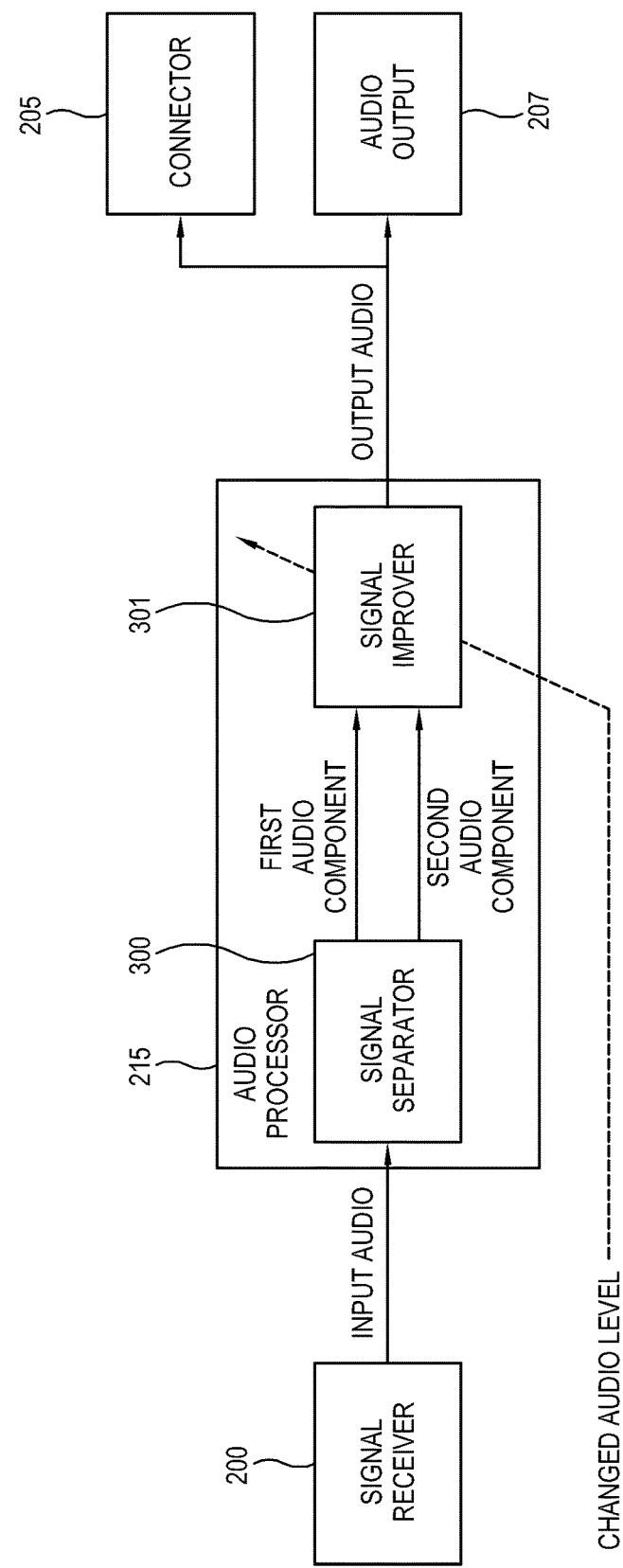
FIG. 3 is a block diagram of an audio processor according to an exemplary embodiment.

FIG. 3 is a block diagram of an audio processor 215 according to an exemplary embodiment.

The audio processor 215 includes a signal separator 300 and a signal improver 301. If the input audio is received from the signal receiver 200, the signal separator 300 separates the received input audio into the first audio component 100 and the second audio component 101. The signal improver 301 receives the separated first and second audio components 100 and 101 and regulates amplification degrees of the first audio component 100 and the second audio component 101 based on the received instruction to change a level of audio to be output. The regulation of the amplification degrees of the first audio component 100 and the second audio component 101 may be performed under the control of the controller 209. According to another exemplary embodiment, the signal improver 301 regulates rate of change of the level of the first audio component and a rate of change of the level of the second audio component based on the received instruction to change a level of audio to be output.

The signal improver 301 adjusts levels of the first audio component 100 and the second audio component 101 with reference to the changed ratio of the first audio component 100 to the second audio component 101 according to the control of the controller 209. The signal improver 301 mixes the adjusted first and second audio components 100 and 101 to output an output audio.

Figure 4:
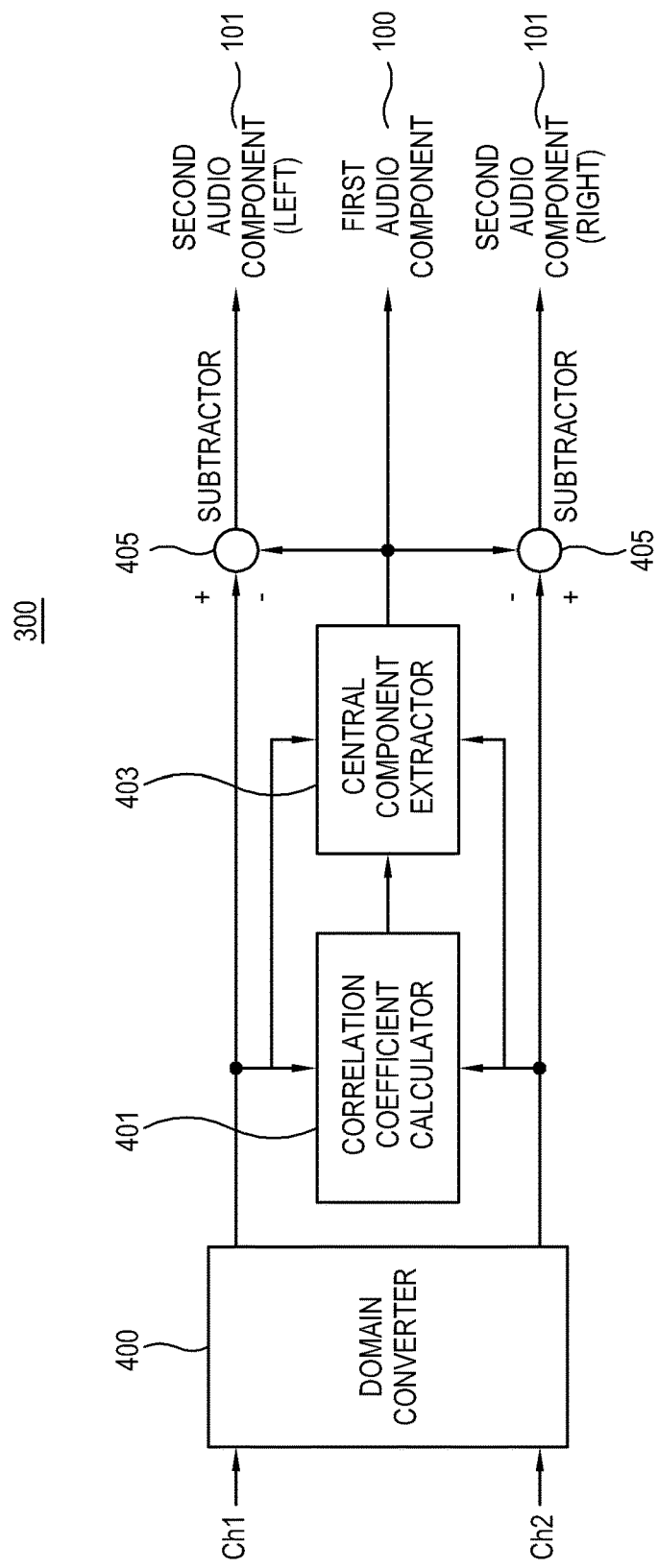
FIG. 4 is a block diagram of a signal separator according to an exemplary embodiment.

Hereinafter, detailed configurations of the signal separator 300 and the signal improver 301 according to an exemplary embodiment will be described with reference to block diagrams illustrated in FIGS. 4 and 5. FIG. 4 is a block diagram of a signal separator 300 according to an exemplary embodiment. The signal separator 300 according to an exemplary embodiment may separate the first audio component 100 and the second audio component 101 as a central component and a peripheral component, respectively. The central component according to an exemplary embodiment may be an audio component such as, for example, performer's lines or narrations from among an audio in a content such as a movie, a drama or the like. If the input audio signal is 2 channels (stereo), the central component of output audio may be panned to a front center of the electronic apparatus 1.

The signal separator 300 includes a domain converter 400, a correlation coefficient calculator 401, a central component extractor 403 and a subtractor 405.

The domain converter 400 receives an audio signal including a first channel and a second channel to perform a domain conversion. The domain converter 400 converts the stereo signal into a frequency domain via an algorithm, such as a fast Fourier transform (FFT) or the like.

The correlation coefficient calculator 401 calculates a correlation coefficient using the audio signal converted to the frequency domain by the domain converter 400. The correlation coefficient calculator 401 calculates a first coefficient, which indicates a coherence between the two channels included in the audio signal, and a second coefficient, which indicates a similarity between the two channels, and calculates the correlation coefficient using the first coefficient and the second coefficient. The correlation coefficient calculator 401 transmits the calculated correlation coefficient to the central component extractor 403.

The central component extractor 403 extracts the first audio component 100 from the audio signal using the correlation coefficient and the audio signal. The central component extractor 403 calculates an arithmetic mean of the audio signal and multiplies the calculated arithmetic mean by the correlation coefficient to generate the first audio component 100.

The subtractor 405 calculates a difference between the audio signal and the first audio component 100 at a time domain. The subtractor 405 subtracts the first audio component 100 from a left audio signal to generate a second audio component-left signal and subtracts the first audio component 100 from a right audio signal to generate a second audio component-right signal. The second audio component 101 may be expressed as a sum of the second audio component-left signal and the second audio component-right signal.

Although in the drawings and the descriptions as described above, the audio signal has been explained as being 2-channel signal, the present disclosure is not limited thereto and may be applied in the same principle even if the input signal is a multichannel audio signal, such as 5.1 or more-channel signal.

Figure 5:
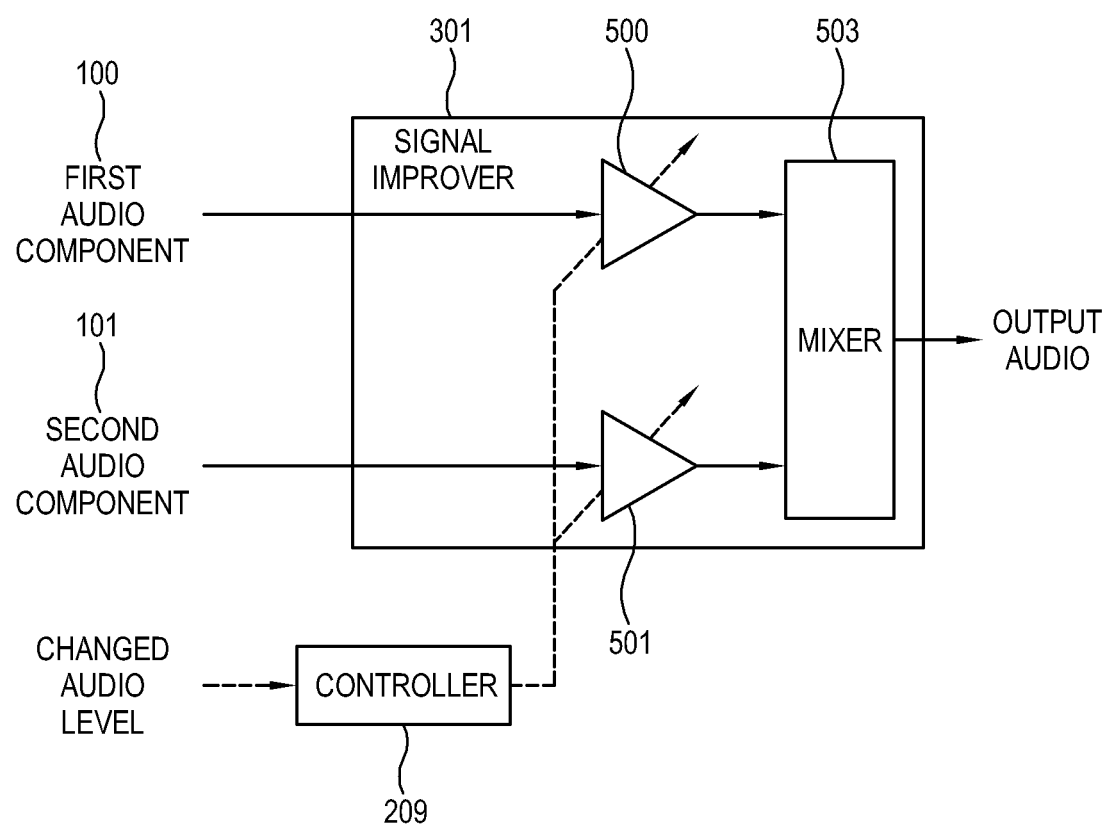
FIG. 5 is a block diagram of a signal improver according to an exemplary embodiment.

FIG. 5 is a block diagram of a signal improver 301 according to an exemplary embodiment.

The signal improver 301 receives the first audio component 100 and the second audio component 101 from the signal separator 300. The signal improver 301 amplifies the first audio component 100 and the second audio component 101 according to the control of the controller 209, mixes the amplified first and second audio components 100 and 101 to generate an output audio, and outputs the generated output audio. The signal improver 301 may include amplifiers 500 and 501 for amplifying the first audio component 100 and the second audio component 101, respectively, and a mixer 503 for mixing and outputting the amplified first and second audio components 100 and 101.

If the level of audio is changed, the controller 209 controls the signal improver 301 to change the ratio of the first audio component 100 to the second audio component 101 according to the changed level of audio. The amplifiers 500 and 501 changes amplification coefficients (hereinafter, also referred as "gains") of the first audio component 100 and the second audio component 101 based on the control of the controller 209, and amplifies and outputs the first audio component 100 and the second audio component 101 based on the changed gains. The mixer 503 mixes the amplified first and second audio components 100 and 101 to generate the output audio, and outputs the generated output audio.

An example of changing the ratio of the first audio component 100 to the second audio component 101 is not limited to the drawings and explanations as described above. Hereinafter, as another exemplary embodiment of changing the ratio of the first audio component 100 to the second audio component 101, an exemplary embodiment of emphasizing a specific component at a frequency domain will be described.

Figure 6:
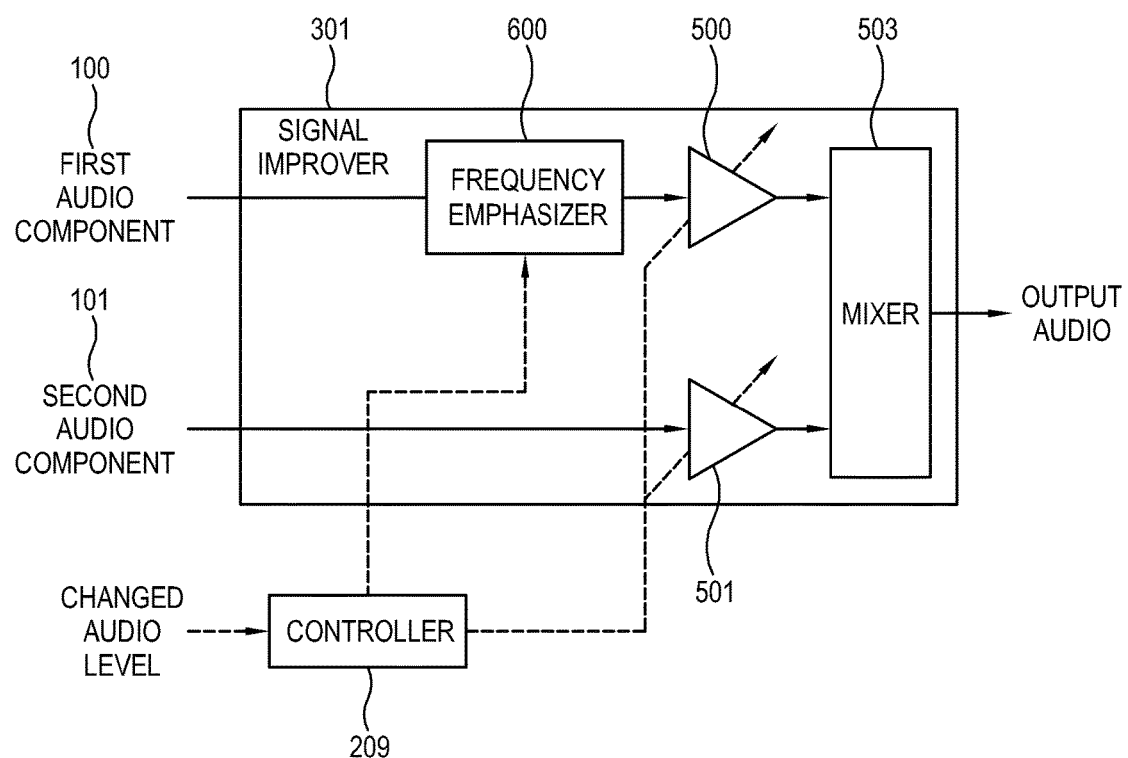
FIG. 6 is a block diagram of a signal improver including a frequency emphasizer according to an exemplary embodiment.

FIG. 6 is a block diagram of a signal improver 301 including a frequency emphasizer according to another exemplary embodiment. The signal improver 301 may include a frequency emphasizer 600 configured to emphasize a peak, which corresponds to the first audio component 100 at a frequency area, a peak, which corresponds to the second audio component 101 at a frequency area or a peak, which corresponds both the first audio component 100 and the second audio component 101 at a frequency area. The peak emphasis according to an exemplary embodiment may be performed along with the change in the ratio of the first audio component 100 to the second audio component 101 by the gain change, as described above with reference to FIG. 5. Alternatively, the peak emphasis may be performed replacing the gain change, or without the gain change.

As illustrated in FIG. 6, the frequency emphasizer 600 is provided before the amplifier 500 for the first audio component 100, and selectively emphasizes a peak, which corresponds to the first audio component 100 at the frequency area, based on the control of the controller 209. Before the first audio component 100 and the second audio component 101 are mixed, the frequency emphasizer 600 may emphasize the peak, which corresponds to the first audio component 100 at the frequency area, according to the changed level of audio. With the frequency emphasizer 600 according to an exemplary embodiment, the peak, which corresponds to the first audio component 100 at the frequency area, may be emphasized to give relatively more prominence to the first audio component 100 than the second audio component 101 even if the gain of the first audio component 100 is increased. Thus, at the same volume level, the first audio component 100 may be relatively emphasized.

As another exemplary embodiment, to selectively emphasize a peak of the second audio component 101, the frequency emphasizer 600 may be provided before the amplifier 501 for the second audio component 101. As other exemplary embodiment, the frequency emphasizer 600 may be disposed provided behind the mixer 503, and selectively emphasize a peak, which corresponds to the first audio component 100 and/or the second audio component 101 from among the mixed output audio, according to the control of the controller 209.

FIGS. 7A, 7B and 7C illustrate graphs showing ratios of a first audio component to a second audio component according to a level of audio. In FIGS. 7A, 7B and 7C, respective graphs 800, 801, and 803 plot a level of audio having a volume scale of 0~100 on an X-axis and a ratio of the first audio component 100 to the second audio component 101 in decibel dB on an Y-axis.

In FIG. 7A, the graph 800 illustrates an exemplary case, in which, the ratio of the first audio component 100 to the second audio component 101 is not changed according to the level of audio. According to the graph 800, the signal improver 301 maintains the ratio of the first audio component 100 to the second audio component 101 as it is even if the level of audio is changed. The graph 800 illustrates an example that at a so-called default state, the ratio of the first audio component 100 to the second audio component 101 is not changed according to the level of audio. In the graph 800, the ratio of the first audio component 100 to the second audio component 101 is illustrated as being 0 dB (i.e., there is no difference between the first audio component 100 and the second audio component 101), but is not limited thereto. In other words, even at the default state, there may be a certain degree of difference in size between the first audio component 100 and the second audio component 101.

In FIG. 7B, the graph 801 illustrates another exemplary case, in which, when the level of audio is less than a standard value A, the first audio component 100 is increased in share as compared to the second audio component 101. For example, the first audio component 100 is relatively more emphasized as compared to the second audio component 101. According to the graph 801, when the level of audio is equal to or more than the standard value A, the signal improver 301 maintains the ratio of the first audio component 100 to the second audio component 101 as it is even if the level of audio is changed. On the other hand, when the changed level of audio is less than the standard value A, the signal improver 301 changes the ratio, so that the lower the level of audio is, the more the first audio component 100 increased in share in the output audio, thereby emphasizing the first audio component 100. Accordingly, when the audio is processed as in this exemplary scenario, the first audio component 100 may be emphasized at a small level of audio, so that a high first audio component 100 can be obtained even at a low volume.

In FIG. 7C, the graph 803 illustrates another exemplary case, in which, when the level of audio is less than a standard value B, the more the first audio component 100 is increased in share as compared to the second audio component 101 and when the level of audio is equal to or more than the standard value B, the more the second audio component 101 is increased in share as compared to the first audio component 100. According to the graph 803, when the level of audio is equal to or more than the standard value B, the signal improver 301 changes the ratio, so that the higher the level of audio is, the more the second audio component 101 is increased in share in the output audio, thereby emphasizing the second audio component 101. Also, when the level of audio is less than the standard value B, the signal improver 301 controls the ratio, so that the lower the level of audio is, the more the first audio component 100 is increased in share in the output audio, thereby emphasizing the first audio component 100. For example, if the user watches a content, such as a movie, at a low volume, the first audio component 100 corresponding to performer's lines may be emphasized, thereby more enhancing an effect of communicating information, whereas at a high volume, the second audio component 101 corresponding to a background audio in the content may be emphasized, thereby obtaining an effect of increasing a feeling of sound field. As another example, in a scenario such as sports broadcasting, it may be important to communicate voice information of a sports commentator and to deliver the feeling of sound field in site, such as cheering of audiences in sports ground, the audio processing corresponding to the graph 803 may make the user concentrate on the voice of the sports commentator when listening the audio in a low volume and feel an improved sense of immediacy when listening the audio in a high volume.

According to another exemplary embodiment, the signal improver 301 may hold a plurality of standard values different from each other and change the ratio of the first audio component 100 of the second audio component 101 on the basis of the plurality of standard value. For example, if the level of audio is less than a first standard value, the signal improver 301 may change the ratio, so that the lower the level of audio is, the first audio component 100 is gradually emphasized. If the level of audio is between the first standard value and a second standard value larger than the first standard value, the signal improver 301 may maintain the ratio of the first audio component 100 of the second audio component 101 as it is. If the level of audio is equal to or more than the second standard value, the signal improver 301 may change the ratio, so that the higher the level of audio is, the second audio component 101 is gradually emphasized. Examples of changing the ratio according to the changed level of audio of the first audio component 100 of the second audio component 101 are not limited to the drawings and explanations as described above.

According to an exemplary embodiment, the change of the ratio of the first audio component 100 to the second audio component 101 according to the changed level of audio may be perform based on a predetermined condition. As an example of the predetermined condition, the electronic apparatus 1 may change the ratio of the first audio component 100 to the second audio component 101 based on information (hereinafter, also referred to an 'audio component ratio information'), which expresses the ratio of the first audio component 100 to the second audio component 101 corresponding to the level of audio. The audio component ratio information may be, for example, information expressing any one from among the graphs 800, 801 and 803, as illustrated in FIGS. 7A, 7B and 7C. The electronic apparatus 1 may select any one from among the graphs 800, 801 and 803 based on the audio component ratio information and change the ratio of the first audio component 100 to the second audio component 101 according to changes in the level of audio based on the selected graph 800, 801 or 803. The electronic apparatus 1 may apply single audio component ratio information with respect to a plurality of contents en bloc (i.e., all together or all at the same time), or audio component ratio information different from each other according to contents separately.

The audio component ratio information may be stored in advance or received from an outside. In the latter case, the electronic apparatus 1 may receive the audio component ratio information, for example, via a broadcast signal of providing contents or from an external apparatus, such as a peripheral apparatus, a network server or the like. The audio component ratio information may be received solely or in one package with a specific content.

As another example of the predetermined condition, the electronic apparatus 1 may change the ratio of the first audio component 100 to the second audio component 101 (hereinafter, also referred to an 'audio component ratio') based on a user input. For example, the electronic apparatus 1 may select any one from among the graphs 800, 801 and 803 based on the user input and if a level of audio is changed, change the audio component ratio in a value corresponding to the changed level of audio based on the selected graph 800, 801 or 803. To receive the user input, which determines the audio component ratio, the electronic apparatus 1 may provide a user interface (UI). The UI for the determination of the audio component ratio may include at least one menu item required to determine the audio component ratio. The at least one menu item may be configured to enable the user to select any one from the plurality of graphs according to the user input or to change a specific audio component in any graph. Also, the UI may be configured to recommend any graph suited for a content being provided or any graph selected by a plurality of users.

As further another example of the predetermined condition, the electronic apparatus 1 may change the audio component ratio according to the changed level of audio, based on a previous use history of the user or a type of content. For example, the electronic apparatus 1 may select any one from among the graphs 800, 801 and 803 based on the previous use history of the user or the type of content and if the level of audio is changed, change the audio component ratio in a value corresponding to the changed level of audio based on the selected graph 800, 801 or 803.

Figure 8A:
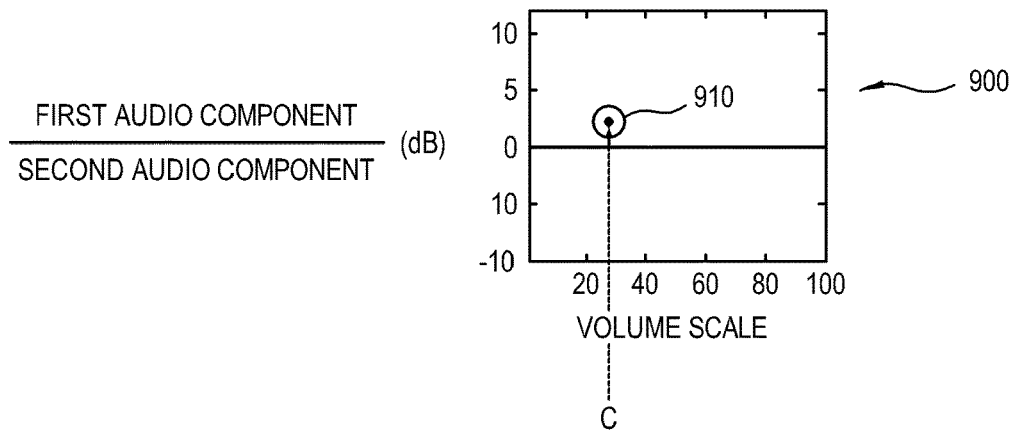
FIGS. 8A, 8B and 8C illustrate examples of changing the ratio of the first audio component to the second audio component according to an exemplary embodiment.
Figure 8B:
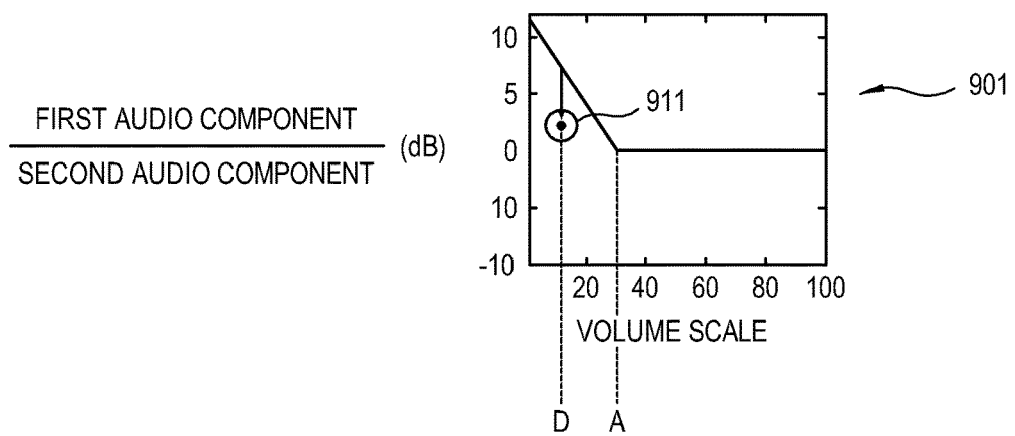
Figure 8C:
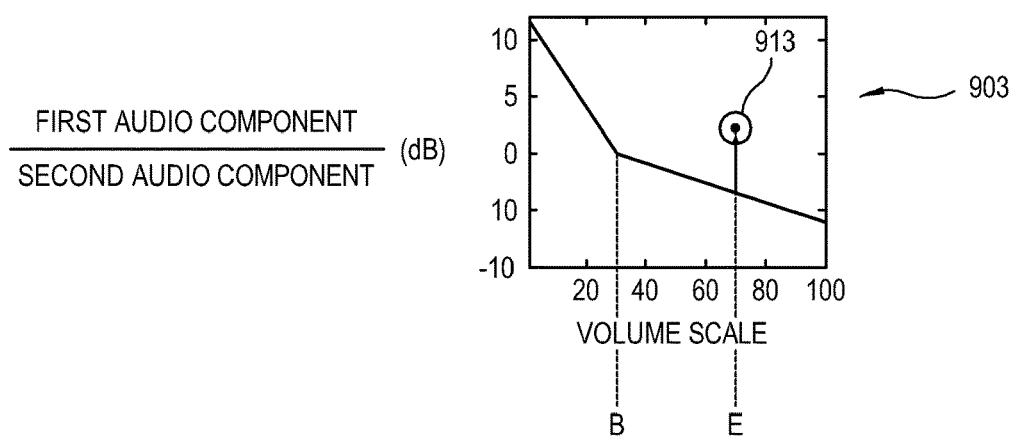

As yet another example of the predetermined condition, the electronic apparatus 1 may determine whether a given condition is satisfied and if it is determined that the given condition is satisfied, change the audio component ratio. FIG. 8A, 8B, 8C illustrate examples of changing the audio component ratio according to whether the given condition is satisfied. As a first example illustrated in FIG. 8A, a graph 900 shows that a ratio of the first audio component 100 to the second audio component 101 is maintained as it is even if the level of audio is changed. If a level of audio is C, a determined ratio of the first audio component 100 to the second audio component 101 is 0 dB. In this situation, if the given condition is satisfied, the signal improver 301 changes the ratio of the first audio component 100 to the second audio component 101 to emphasize an audio component the user wants from among the first audio component 100 and the second audio component 101. Accordingly, even if there is no direct user input, the signal improver 301 may emphasize the audio component the user wants estimating the user intention only by the given condition, thereby providing a more enhanced user convenience. The given condition according to an exemplary embodiment includes at least one of an ambient illuminance intensity, an ambient sound and/or voice, a number of users, a location of user (users), a type of displayed image and an existence or nonexistence of closed caption. The given condition will be again described in detail later.

As another exemplary embodiment, an example of additionally changing the ratio of the first audio component 100 to the second audio component 101 according to a given condition in addition to the change of the ratio of the first audio component 100 of the second audio component 101 described with reference to FIGS. 1 to 7 will be described. In FIGS. 8B and 8C, graphs 901 and 903 illustrate examples of additionally changing the ratio of the first audio component 100 to the second audio component 101. The signal improver 301 changes the ratio of the first audio component 100 to the second audio component 101 according to the changed level of audio. Also, as the given condition is satisfied, the signal improver 301 additionally change the ratios of the first audio component 100 to the second audio component 101 changed at specific levels of audio D and E, thereby to determine new ratios 911 and 913 of the first audio component 100 to the second audio component 101. With this, the signal improver 301 may emphasize the audio component the user wants more precisely estimating the user intention through the given condition as well as the direct user input, thereby providing a more enhanced user convenience.

Hereinafter, the given condition for changing the ratio of the first audio component to the second audio component will be described in detail. To determine whether the given condition is satisfied, the electronic apparatus 1 may further include at least one sensor for detecting an ambient illuminance intensity, an ambient sound and/or voice, and a number and a location of users, which watch the electronic apparatus 1.

The electronic apparatus 1 may change the ratio of the first audio component 100 to the second audio component 101 based on the ambient illuminance intensity detected at the sensor. To be more specific, the controller 209 may control the signal improver 301, so that if a level of the ambient illuminance intensity is less than a standard value, the lower the level of the ambient illuminance intensity is, the more the first audio component 100 is increased in share and if the level of the ambient illuminance intensity is equal to or more than the standard value, the higher the level of the ambient illuminance intensity is, the more the second audio component 101 is increased in share. For example, if the user watches the content, such as the movie, the controller 209 may control the signal improver 301, so that the lower the level of the ambient illuminance intensity is, the more the first audio component 100 corresponding to the performer's lines is increased in share, and the higher the level of the ambient illuminance intensity is, the more the second audio component 101 corresponding to the background audio in the content is increased in share.

Figure 13:
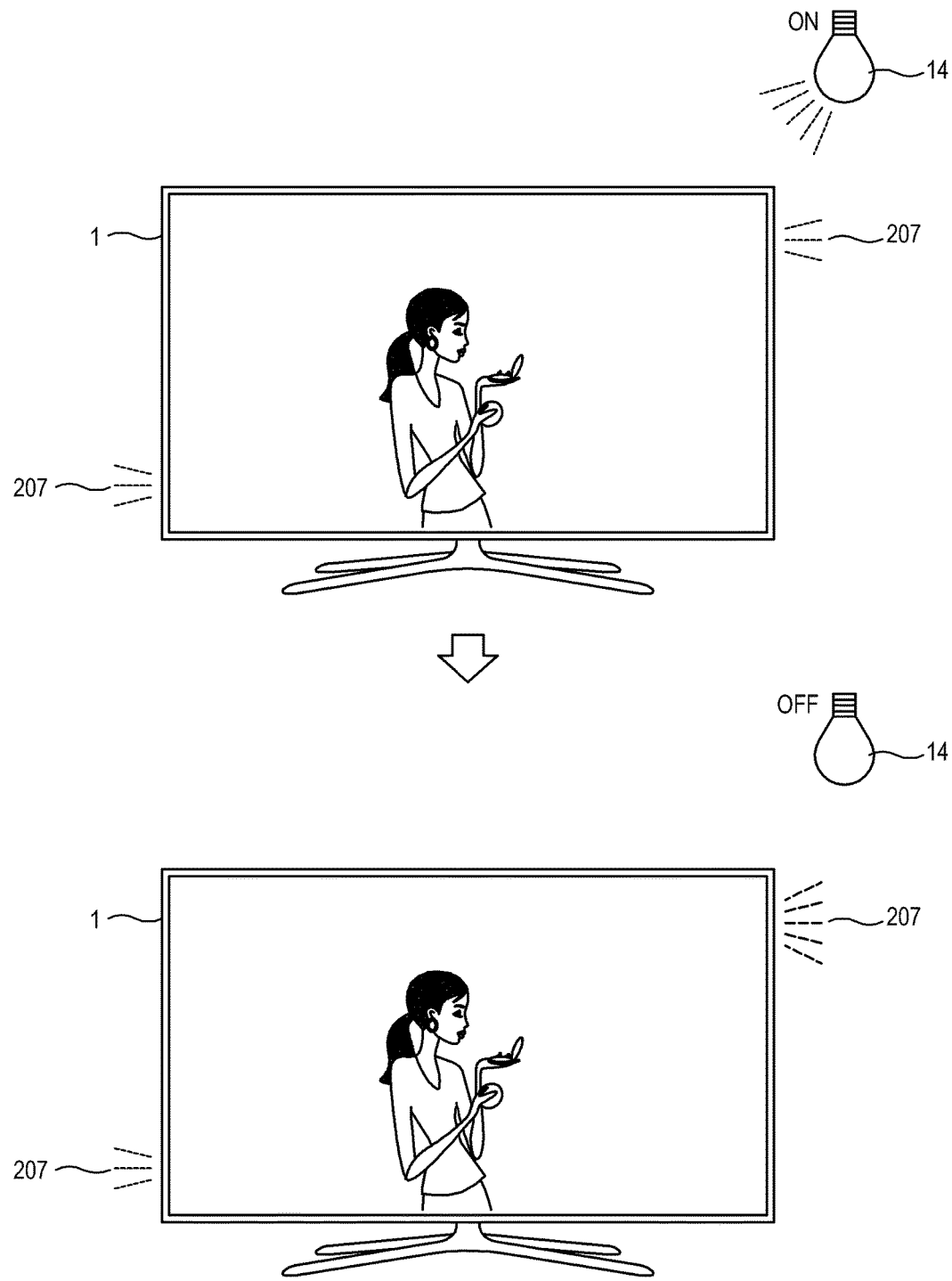
FIG. 13 illustrates an example of additionally changing the ratio of the first audio component to the second audio component based on an ambient illuminance intensity according to an exemplary embodiment.

For example, FIG. 13 illustrates an exemplary embodiment of changing the ratio of the first audio component to the second audio component based on the ambient illuminance intensity. Referring to a top view of FIG. 13, if the ambient illuminance intensity is equal or more than a critical value as a light source 14 adjacent to the electronic apparatus 1 is in an on-state, the electronic apparatus 1 outputs the first audio component 100 and the second audio component 101 in the same level. Referring to a bottom view of FIG. 13, if the ambient illuminance intensity is less than the critical value as the light source 14 is in an off-state, the electronic apparatus 1 increases any one of the first audio component 100 and the second audio component 101 in share to output emphasizing a corresponding audio component 100 or 101.

The explanations and the drawings as described above are merely examples and the present disclosure may be applied to various embodiments of changing the ratio of the first audio component 100 to the second audio component 101 based on the ambient illuminance intensity.

According to another exemplary embodiment, the electronic apparatus 1 may sense an ambient sound and change the ratio of the first audio component 100 of the second audio component 101 based on the sensed sound. For example, if it is quiet near the electronic apparatus 1 (i.e., environmental noise is low), the electronic apparatus 1 may determine a current situation as a situation where the user is concentrating on a content. Accordingly, if a level of the ambient sound is less than a critical value, the electronic apparatus 1 may increase any one of the first audio component 100 and the second audio component 101 in share to emphasize a corresponding audio component 100 or 101.

Figure 14:
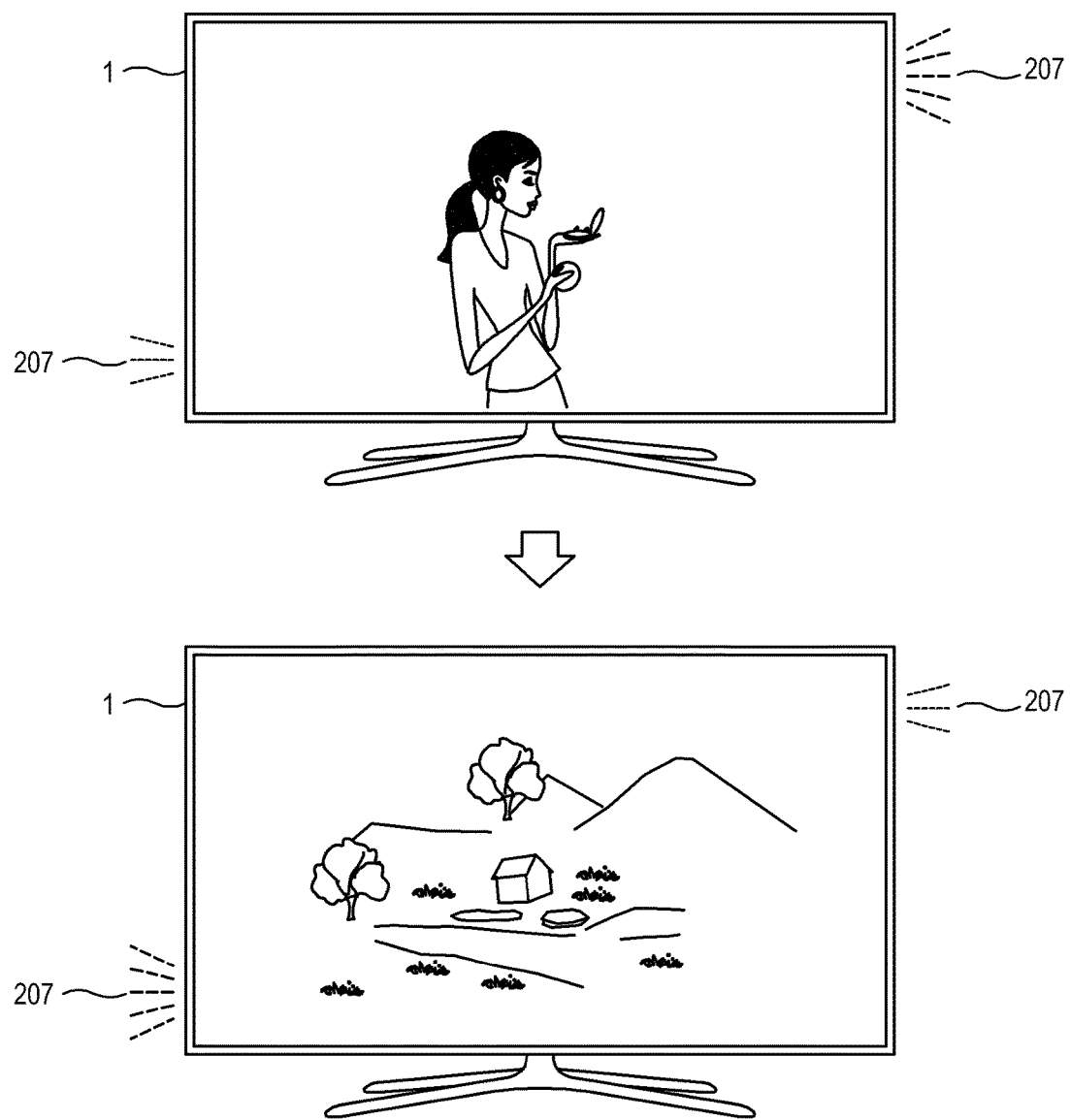
FIG. 14 illustrates an example of additionally changing the ratio of the first audio component to the second audio component based on a type of content according to an exemplary embodiment.

As further another exemplary embodiment, the electronic apparatus 1 may change the ratio of the first audio component 100 to the second audio component 101 based on an attribute of content being provided. The attribute of content may include a type of content, and the type of content may be grasped via information received along with the content, a search or the like. FIG. 14 illustrates an example of changing the ratio of the first audio component 100 to the second audio component 101 based on the attribute of content. Referring to a top view of FIG. 14, if the provided content is a content, such as a learning broadcasting, a drama and the like, in which it is important to accurately deliver information, the electronic apparatus 1 increases the first audio component 100, such as lines, narrations, or the like, corresponding to the delivery of the information in share. Referring to a bottom view of FIG. 14, if the provided content is a content, such as a performance, a sports, a natural environment documentary, or the like, in which it is important to deliver a vivid sense of immediacy, the electronic apparatus 1 increases the second audio component 101, such as a background audio or the like, corresponding to the sense of immediacy in share.

As an additional exemplary embodiment, the electronic apparatus 1 may change the ratio of the first audio component 100 to the second audio component 101 according to a screen content being currently displayed in one content. For example, whenever scenes change while a movie is displayed, the electronic apparatus 1 may adaptively change the ratio of the first audio component 100 to the second audio component 101 according to contents of respective scenes.

The explanations and the drawings as described above are merely examples and the present disclosure may be applied to various embodiments of changing the ratio of the first audio component 100 to the second audio component 101 based on the type of content.

According to another exemplary embodiment, the electronic apparatus 1 may change the ratio of the first audio component 100 to the second audio component 101 based on whether there are closed captions in a content being displayed. For example, if the user reduces a volume below a standard value, the closed captions are not displayed on the screen, the electronic apparatus 1 increases the first audio component 100, such as the lines, corresponding to the information delivery in share. On the other hand, if even though the user reduces the volume below the standard value, the closed captions are displayed on the screen, the electronic apparatus 1 may determine that there is very little difficulty to deliver required information and maintain the ratio of the first audio component 100 to the second audio component 101 as it was before the user reduces the volume below the standard value.

Figure 15:
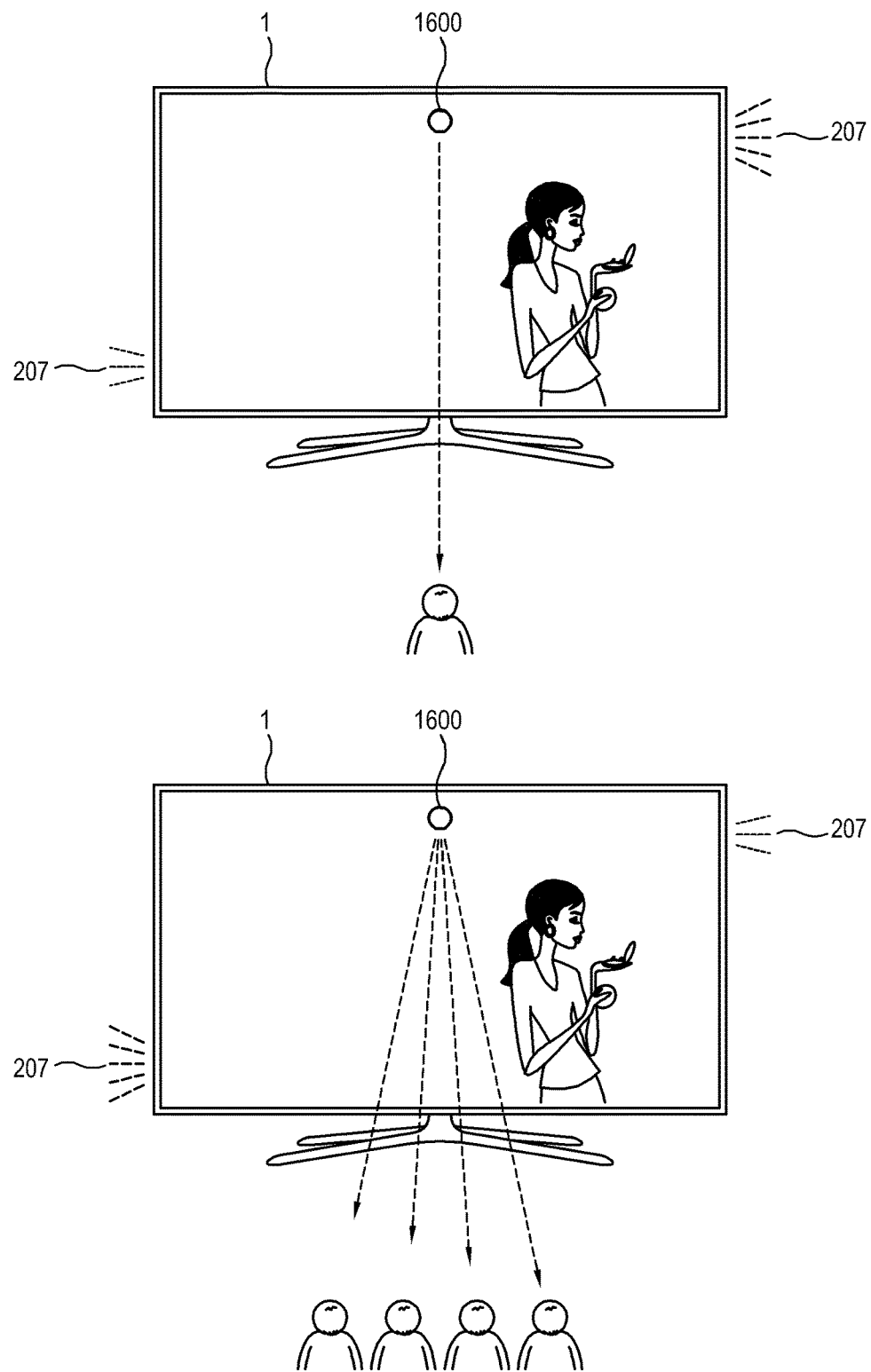
FIG. 15 illustrates an example of additionally changing the ratio of the first audio component to the second audio component based on a number of detected users according to an exemplary embodiment.

According to another exemplary embodiment, the electronic apparatus 1 may change the ratio of the first audio component 100 to the second audio component 101 based on the number of users or a location of user (users). The sensor may include a camera for detecting the number or location of users (user), which watch the electronic apparatus 1. For example, FIG. 15 illustrates an example of changing the ratio of the first audio component 100 to the second audio component 101 based on the number of users. As illustrated in a top view of FIG. 15, if the number of the users who watch the electronic apparatus 1 is small, the electronic apparatus 1 may determine a current situation as a situation where the users concentrates on the content. In other words, if the number of the detected users is small, the electronic apparatus 1 increases the first audio component 100, such as the lines, corresponding to the information delivery in share. To the contrary, as illustrated in a bottom view of FIG. 15, if the number of the users who watch the electronic apparatus 1 is large, the electronic apparatus 1 may increase the second audio component 101 corresponding to the background audio in share.

On the other hands, the location of user (users) with respect to the electronic apparatus 1 may be an indicator of representing user's concentration level with respect to the content according to another exemplary embodiment. FIG. 16 illustrates an example of changing the ratio between the first audio component 100 and the second audio component 101 based on a location of a user who watches the electronic apparatus 1. As illustrated in a top view of FIG. 16, if the user is located closer to the electronic apparatus 1, the electronic apparatus 1 may increase the first audio component 100, such as the actor's lines, corresponding to the information delivery, in share. To the contrary, as illustrated in a bottom view of FIG. 16, if the more the user is far from the electronic apparatus 1, the more the electronic apparatus 1 may increase the second audio component 101 corresponding to the background audio in share.

The present disclosure is not limited to illustrations and explanations as described above. The controller 209 may change the ratio of the first audio component 100 to the second audio component 101 using the given condition as described above along with or regardless of the changed level of audio. The given condition may also include various conditions required to grasp user's intentions of changing audio characteristic, besides the illustrations as described above.

Figure 9:
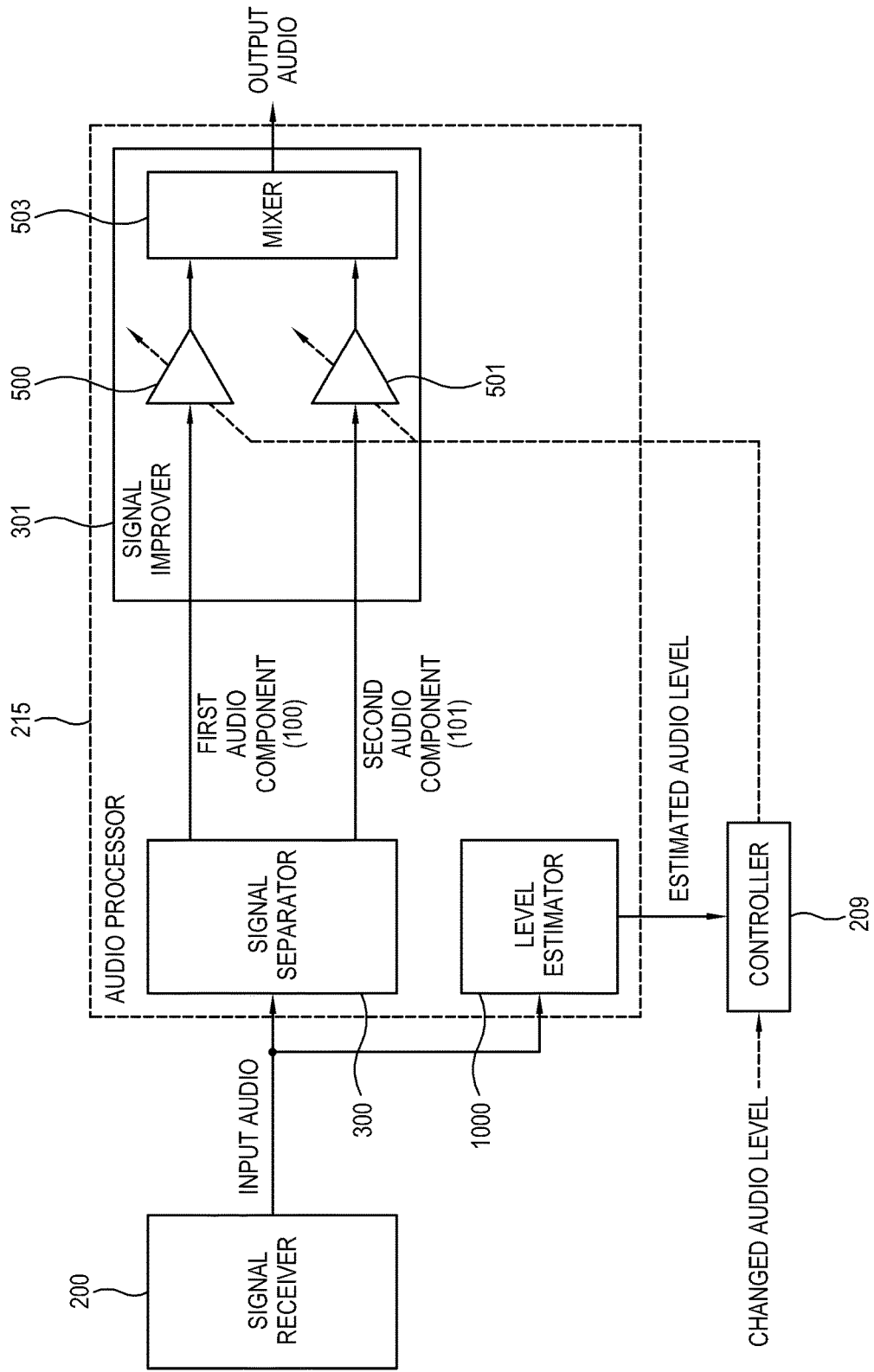
FIGS. 9 and 10 are block diagrams of an audio processor of according to an exemplary embodiment.
Figure 10:
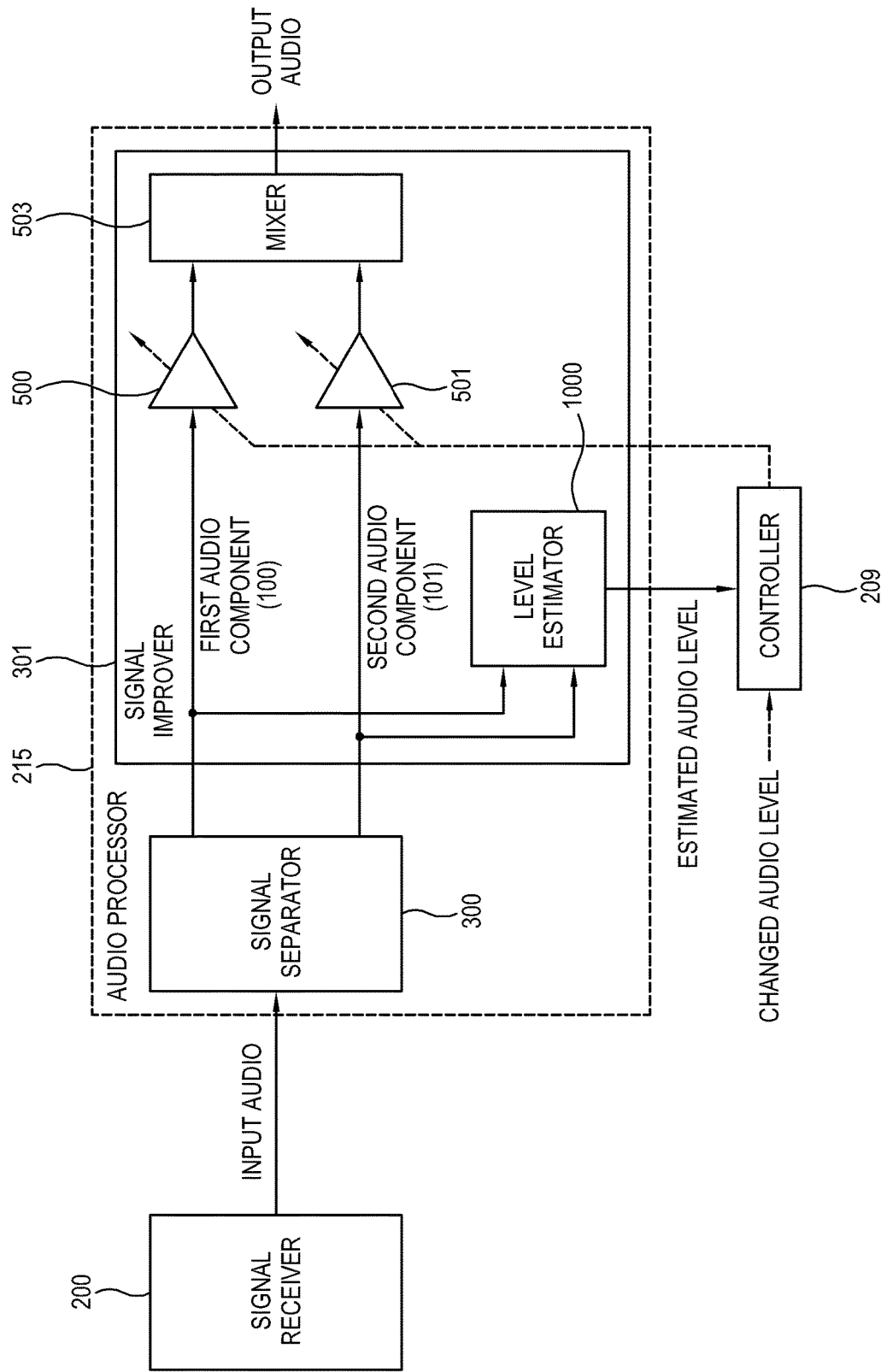

FIGS. 9 and 10 are block diagrams an audio processor including a level estimator of according to an exemplary embodiment. FIG. 9 illustrates an example in which a level estimator 1000 is provided in the audio processor 215. There are often deviations in the level of audio according to genres or characteristics of the content, or broadcasting stations. For example, if the user are watching a silent movie and then the silent movie is changed into a commercial broadcast, a high level of audio, which does not comply with the level of audio the user set, may be output. The audio processor 215 may include the level estimator 1000, which estimates a level of audio from an input audio signal and outputs the estimated level of audio (hereinafter, an 'estimated audio level'). The controller 209 may control the signal improver 301 to adjust the level of audio based on a relation between the level of audio changed by the user input or the like and the estimated audio level. For example, if the changed level of audio and the estimated audio level are the same, the controller 209 may control the signal improver 301 not to additionally amplify the level of audio. Accordingly, with the level estimator 1000, the output level of audio is adjusted to comply with the user's intention, thereby providing a more improves user convenience.

FIG. 10 illustrates a level estimator 1000 provided in the signal improver 301 according to an exemplary embodiment. The signal improver 301 may include the level estimator 1000, which receives the first audio component 100 and the second audio component 101 from the signal separator 300 and transmits estimated audio levels for the first and second audio components 100 and 101 to controller 209. The ratio between first audio component 100 and the second audio component 101 included in the input audio signal may be pre-changed and inputted. The level estimator 1000 estimates levels for the first and the second audio components 100 and 101 and the controller 209 controls the signal improver 301 based on the estimation of the level estimator 1000. Accordingly, the ratio of the first audio component 100 to the second audio component 101 may be changed to more comply with the user's intention.

Figure 11:
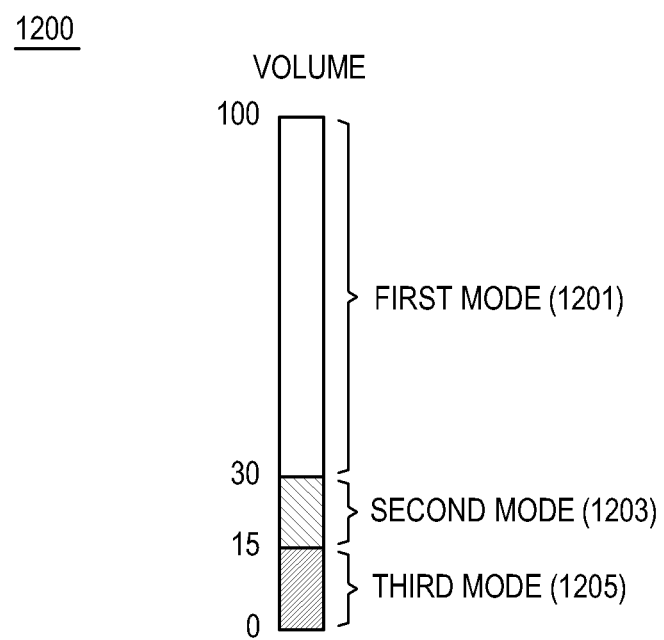
FIGS. 11 and 12 illustrate examples of operating an electronic apparatus in a plurality of operation modes depending on a level of audio according to an exemplary embodiment.
Figure 12:
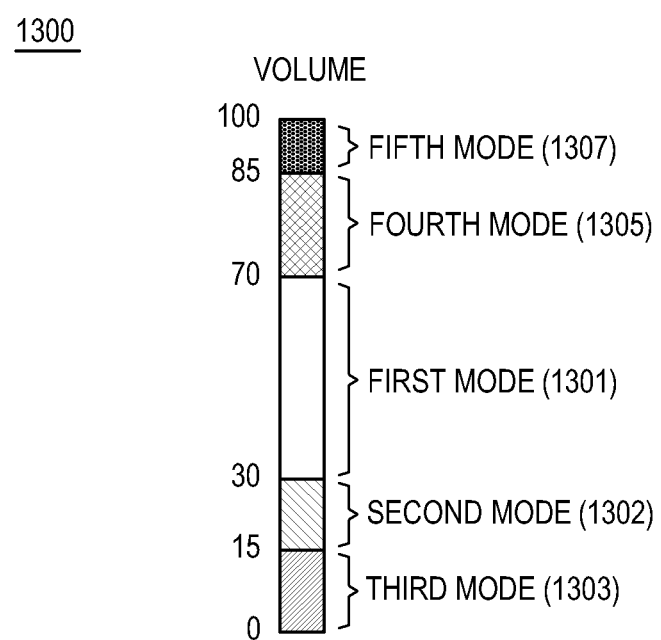

FIGS. 11 and 12 illustrate examples of operating the electronic apparatus 1 in a plurality of operation modes depending on the level of audio. The electronic apparatus 1 illustrated in FIGS. 11 and 12 includes the plurality of operation modes, each of which has different audio component ratios. The controller 209 may select an operation mode, from among the plurality of operation modes, depending on the level of audio. FIG. 11 illustrates an example 1200 in which the electronic apparatus 1 is operated in one of three acoustic modes depending on the level of audio according to an exemplary embodiment. Referring to FIG. 11, at a range where the level of audio is 30~100, the electronic apparatus 1 is operated in a first acoustic mode 1201, which is a normal state. A ratio of the first audio component 100 to the second audio component 101 output while the electronic apparatus 1 is operated in the first acoustic mode 1201 is maintained in 1:1 or a value close thereto. At a range where the level of audio is 15~30, the electronic apparatus 1 is operated in a second acoustic mode 1203 in which the first audio component 100, for example, such as the lines, corresponding to the information delivery, is emphasized. If the level of audio is less than 15, the electronic apparatus 1 may be operated in a third acoustic mode 1205 in which the first audio component 100 is more emphasized as compared with in the second acoustic mode 1203. In the exemplary embodiment, the electronic apparatus 1 may provide the acoustic modes in which the audio components the user wants are emphasized, respectively, only by a simple volume manipulation of the user without any other user manipulation.

FIG. 12 illustrates an example 1300 in which the electronic apparatus 1 is operated in one of five acoustic modes depending on the level of audio according to another exemplary embodiment. Referring to FIG. 12, at a range where the level of audio is 30~70, the electronic apparatus 1 is operated in a first acoustic mode 1301, which is a normal state. At a range where the level of audio is 15~30, the electronic apparatus 1 is operated in a second acoustic mode 1302 in which the first audio component 100, for example, such as the performer's lines, corresponding to the information delivery is emphasized. If the level of audio is less than 15, the electronic apparatus 1 is operated in a third acoustic mode 1303 in which the first audio component 100 is more emphasized as compared with in the second acoustic mode 1302. At a range where the level of audio is 70~85, the electronic apparatus 1 is operated in a fourth acoustic mode 1305 in which the second audio component 101 corresponding to, for example, the background audio is emphasized to increase the feeling of sound field. At a range where the level of audio is 85~100, the electronic apparatus 1 is operated in a fifth acoustic mode 1307 in which the second audio component 101 is more emphasized as compared with in the fourth acoustic mode 1305. In the exemplary embodiment, the electronic apparatus 1 may improve the information delivery at a low audio level and provide the improved sense of immediacy at a high audio level, only by the simple volume manipulation of the user without any other user manipulation.

The present disclosure is not limited to the number of acoustic modes, the specific audio levels, which becomes the standard values, and so on, as illustrated in the drawings. According to another exemplary embodiment, the electronic apparatus 1 may be operated in any one selected from the plurality of acoustic modes, based on at least one of the ambient illuminance intensity, the ambient sound, the number of users, the location of user (users), the attribute of content and the existence or nonexistence of closed caption.

Figure 17:
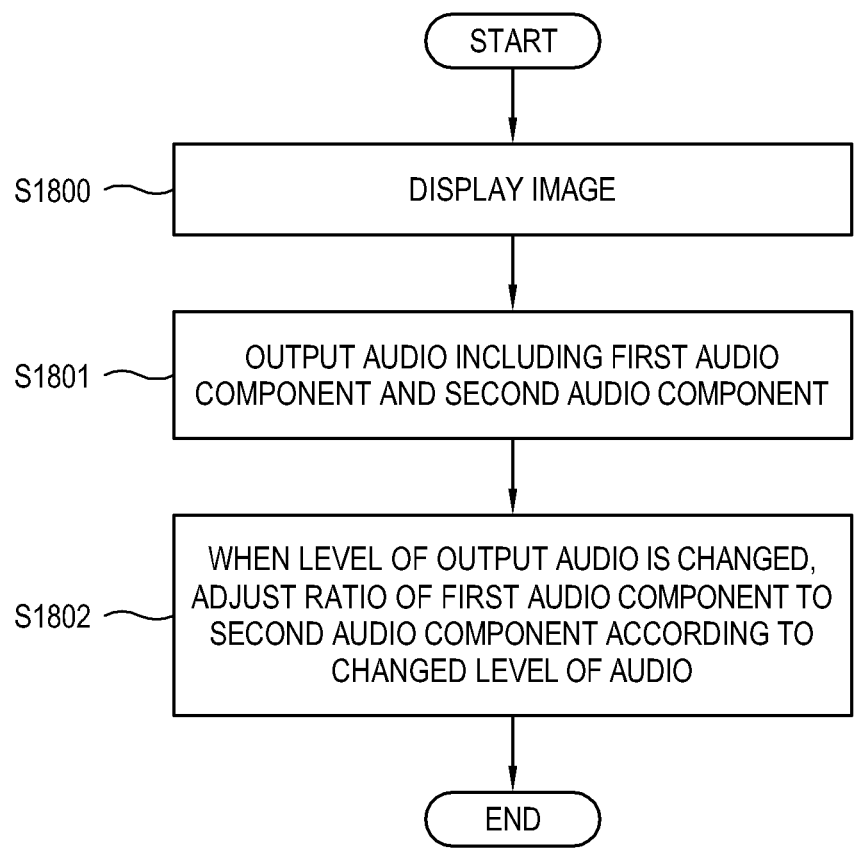
FIG. 17 is a flowchart illustrating a process of controlling an electronic apparatus according to an exemplary embodiment.

FIG. 17 is a flowchart illustrating a process of controlling the electronic apparatus according to an exemplary embodiment.

At operation S1800, the display 203 displays an image. At operation S1801, the audio processor 215 outputs an audio including a first audio component 100 and a second audio component 101. At operation S1802, if a level of the output audio is changed, the controller 209 controls the audio processor 215 to adjust a ratio of the first audio component 100 to the second audio component 101 according to the changed level of audio.

The level of audio may be changed as a user input is received via the input receiver 211 or a specific condition is satisfied. To change the ratio of the first audio component 100 to the second audio component 101, the audio processor 215 may adjust a gain of at least one of the first audio component 100 and the second audio component 101. According to another exemplary embodiment, the audio processor 215 may include a frequency emphasizer 600 and to change the ratio of the first audio component 100 to the second audio component 101, may emphasize a peak of frequency corresponding to the first audio component 100 or the second audio component 101 at a frequency area.

If the changed level of audio is equal to or more than a predetermined standard value, the controller 209 may maintain the ratio of the first audio component 100 to the second audio component 101 as it is, and if the changed level of audio is less than the predetermined standard value, may emphasize the first audio component 101.

In the control method of the electronic apparatus illustrated in FIG. 17, configurations of the electronic apparatus 1 described with reference to FIGS. 1 to 16 may be equally or similarly applied.

While the exemplary embodiments have been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An apparatus comprising:
    an audio processor configured to output an audio including a first audio component and a second audio component; and
    a controller configured to control the audio processor to, in response to receiving an instruction to change a level of the output audio, change a ratio of the first audio component to the second audio component according to the changed audio level,
    wherein the controller is configured to control the audio processor to change the ratio of the first audio component by increasing a proportion of the first audio component compared to the second audio component based on the changed audio level being smaller than a first volume, and increasing a proportion of the second audio component compared to the first audio component based on the changed audio level being larger than a second volume.

2. The apparatus according to claim 1, wherein the controller is further configured to control the audio processor to separate the audio into the first audio component and the second audio component and to adjust a gain of at least one of the first audio component and the second audio component to change the ratio of the first audio component to the second audio component.

3. The apparatus according to claim 2, wherein the controller is further configured to control the audio processor to change the ratio of the first audio component to the second audio component into a first value in response to the changed audio level being equal to or more than a predetermined standard value and to control the audio processor to change the ratio of the first audio component to the second audio component into a second value different from the first value in response to the changed audio level being less than the predetermined standard value.

4. The apparatus according to claim 1, wherein the controller is further configured to control the audio processor to emphasize a peak of the first audio component at a frequency range to change the ratio of the first audio component to the second audio component.

5. The apparatus according to claim 1, wherein the controller is further configured to control the audio processor to change the ratio of the first audio component to the second audio component according to the changed audio level based on a predetermined condition,
the predetermined condition comprises a condition input from a user, received from an outside, or recognized by the apparatus.

6. The apparatus according to claim 1, wherein the controller is further configured to control the audio processor to change the ratio of the first audio component to the second audio component based on at least one of a previous use history of user and a type of content.

7. The apparatus according to claim 1, wherein the first audio component comprises a voice, and the second audio component comprises a background audio.

8. The apparatus according to claim 1, further comprising a display configured to display an image corresponding to the audio.

9. The apparatus according to claim 1, wherein the controller is further configured to control the audio processor to change the ratio of the first audio component to the second audio component according to at least one of an ambient illuminance intensity, an ambient voice, a number of users, a location of user, a type of displayed image and an existence or nonexistence of closed caption.

10. The apparatus according to claim 1, wherein the controller is further configured to change the level of the output audio based on a previous use history and current state information.

11. A control method of an electronic apparatus comprising:
outputting an audio including a first audio component and a second audio component; and
in response to receiving an instruction to change a level of the output audio, changing a ratio of the first audio component to the second audio component according to the changed audio level,
wherein changing the ratio of the first audio component to the second audio component comprises increasing a proportion of the first audio component compared to the second audio component based on the changed audio level being smaller than a first volume, and increasing a proportion of the second audio component compared to the first audio component based on the changed audio level being larger than a second volume.

12. The method according to claim 11, wherein the changing the ratio of the first audio component to the second audio component comprises:
separating the audio into the first audio component and the second audio component; and
adjusting a gain of at least one of the first audio component and the second audio component to change the ratio of the first audio component to the second audio component.

13. The method according to claim 11 wherein the changing the ratio of the first audio component to the second audio component comprises emphasizing a peak of the first audio component at a frequency range to change the ratio of the first audio component to the second audio component.

14. The method according to claim 11, wherein the changing the ratio of the first audio component to the second audio component comprises changing the ratio of the first audio component to the second audio component into a first value in response to the changed audio level being equal to or more than a predetermined standard value and changing the ratio of the first audio component to the second audio component into a second value different from the first value in response to the changed audio level being less than the predetermined standard value.

15. The method according to claim 11, wherein the changing the ratio of the first audio component to the second audio component comprising changing the ratio of the first audio component to the second audio component according to the changed audio level based on a condition input from a user, received from an outside, or recognized by the electronic apparatus.

16. The method according to claim 11, further comprising changing the ratio of the first audio component to the second audio component based on at least one of a previous use history of user and a type of content.

17. The method according to claim 11, wherein the first audio component comprises a voice, and the second audio component comprises a background audio.

18. The method according to claim 11, further comprising displaying an image corresponding to the audio.

19. The method according to claim 11, wherein the changing the ratio of the first audio component to the second audio component comprises changing the ratio of the first audio component to the second audio component according to at least one of an ambient illuminance intensity, an ambient voice, a number of users, a location of user, a type of displayed image and an existence or nonexistence of closed caption.

20. The method according to claim 11, further comprising changing the level of the output audio based on a previous use history and current state information.

* * * * *